United States Patent
Chen et al.

(10) Patent No.: US 11,271,631 B2
(45) Date of Patent: Mar. 8, 2022

(54) POLAR CODED HARQ SCHEME OVER TIME-VARYING CHANNEL

(71) Applicant: Qualcomm Incorporated, San Diego, CA (US)

(72) Inventors: Kai Chen, Shenzhen (CN); Changlong Xu, Beijing (CN); Liangming Wu, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/041,052

(22) PCT Filed: Apr. 2, 2019

(86) PCT No.: PCT/CN2019/080972
§ 371 (c)(1),
(2) Date: Sep. 24, 2020

(87) PCT Pub. No.: WO2019/192461
PCT Pub. Date: Oct. 10, 2019

(65) Prior Publication Data
US 2021/0099213 A1    Apr. 1, 2021

(30) Foreign Application Priority Data
Apr. 4, 2018 (WO) ................ PCT/CN2018/081941

(51) Int. Cl.
*H04B 7/06* (2006.01)
*H04B 17/336* (2015.01)
(Continued)

(52) U.S. Cl.
CPC .......... *H04B 7/0634* (2013.01); *H03M 13/13* (2013.01); *H04B 7/0632* (2013.01);
(Continued)

(58) Field of Classification Search
CPC .. H04B 7/0634; H04B 7/0632; H04B 17/336; H03M 13/13; H04L 1/0041; H04L 1/0057; H04L 1/189
See application file for complete search history.

(56) References Cited

U.S. PATENT DOCUMENTS

| | | | |
|---|---|---|---|
| 2015/0091742 A1 | 4/2015 | Ionita et al. | |
| 2017/0077954 A1 | 3/2017 | Shen et al. | |

(Continued)

FOREIGN PATENT DOCUMENTS

| | | |
|---|---|---|
| CN | 104079370 A | 10/2014 |
| CN | 105743621 A | 7/2016 |

(Continued)

OTHER PUBLICATIONS

International Search Report and Written Opinion—PCT/CN2018/081941—ISA/EPO—Jan. 2, 2019.

(Continued)

*Primary Examiner* — Walter J Divito
(74) *Attorney, Agent, or Firm* — Holland & Hart LLP

(57) ABSTRACT

A device may generate a first set of encoded bits by mapping an information bit vector to a first set of polarized bit channels of a first polar code according to a first bit index set, the first bit index set being based on respective bit channel reliabilities of the first set of polarized bit channels. The device may transmit the first set of encoded bits to another device over a wireless channel. The device may receive an indication that a decoding of the first set of encoded bits was unsuccessful. The device may generate a second set of encoded bits by mapping a repetition of at least one bit to at least one bit channel of a second set of polarized bit channels of a second polar code according to a second bit index set. The device may transmit the second set of encoded bits to the other device.

30 Claims, 20 Drawing Sheets

(51) Int. Cl.
  *H03M 13/13* (2006.01)
  *H04L 1/00* (2006.01)
  *H04L 1/18* (2006.01)

(52) U.S. Cl.
  CPC ......... *H04B 17/336* (2015.01); *H04L 1/0041* (2013.01); *H04L 1/0057* (2013.01); *H04L 1/189* (2013.01)

(56) References Cited

U.S. PATENT DOCUMENTS

| | | | |
|---|---|---|---|
| 2017/0338996 | A1 | 11/2017 | Sankar et al. |
| 2019/0207720 | A1 | 7/2019 | Li et al. |
| 2019/0312679 | A1* | 10/2019 | Jayasinghe ......... H03M 13/095 |
| 2020/0036476 | A1* | 1/2020 | Yang ..................... H04L 1/0068 |
| 2020/0099469 | A1* | 3/2020 | Jiang ..................... H04L 1/0041 |
| 2020/0235851 | A1* | 7/2020 | Mondelli .............. H04L 1/0041 |
| 2021/0050865 | A1* | 2/2021 | Li ........................ H04L 1/1819 |
| 2021/0184696 | A1* | 6/2021 | Wang ..................... H04L 1/0041 |
| 2021/0203361 | A1* | 7/2021 | Noh ..................... H04L 1/0061 |

FOREIGN PATENT DOCUMENTS

| | | |
|---|---|---|
| CN | 106936548 A | 7/2017 |
| WO | WO-2017156792 A1 | 9/2017 |
| WO | WO-2017193296 A1 | 11/2017 |
| WO | WO-2018045849 A1 | 3/2018 |
| WO | WO-2019023244 A1 | 1/2019 |

OTHER PUBLICATIONS

International Search Report and Written Opinion—PCT/CN2019/080972—ISA/EPO—Jul. 5, 2019.

Huawei, et al., "HARQ Scheme for Polar Codes," 3GPP Draft, 3GPP TSG RAN WG1 Meeting #87, R1-1613301, HARQ Scheme for Polar Codes, 3rd Generation Partnership Project (3GPP), Mobile Competence Centre, 650, Route Des Lucioles F-06921 Sophia-Antipolis Cedex, France, vol. RAN WG1, No. Reno, USA, Nov. 14, 2016-Nov. 18, 2016, Nov. 19, 2016, XP051191170, 41 Pages, Retrieved from the Internet: URL: http://www.3gpp.org/ftp/tsg_ran/WG1_RL1/TSGR1_87/Docs/ [retrieved on Nov. 19, 2016], Section 2, figures 4,5, [Lines 4 to 5 of p. 2 and Lines 1 to 2 of p. 3], Section 2.2 "Incremental Redundancy HARQ Design", pp. 3-8, figures 5-7, Section 2.1 "Incremental Freezing HARQ design", pp. 1-3.

Supplementary European Search Report—EP19781411—Search Authority—Munich—dated Dec. 8, 2021.

\* cited by examiner

POLAR CODED HARQ SCHEME OVER TIME-VARYING CHANNEL

CROSS REFERENCES

The present Application is a 371 national phase filing of International Patent Application No. PCT/CN2019/080972 by CHEN et. al., entitled "POLAR CODED HARQ SCHEME OVER TIME-VARYING CHANNEL," filed Apr. 2, 2019; and to International Patent Application No. PCT/CN2018/081941 by CHEN et. al., entitled "POLAR CODED HARQ SCHEME OVER TIME-VARYING CHANNEL," filed Apr. 4, 2018, each of which is assigned to the assignee hereof and each of which is hereby incorporated by reference in its entirety.

BACKGROUND

The following relates generally to wireless communication, and more specifically to polar codes over time-varying channels.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-s-OFDM). A wireless multiple-access communications system may include a number of base stations or network access nodes, each simultaneously supporting communication for multiple communication devices, which may be otherwise known as user equipment (UE).

In some cases, wireless communications between a UE and base station may fail—e.g., due to degraded channel conditions, increased interference, etc. Techniques, such as coding schemes and hybrid automatic repeat request (HARQ) operation, may be used by wireless devices to increase the reliability of wireless communications. In some examples, a transmitting wireless device encodes information bits intended for another wireless device and transmits the encoded bits to the other wireless device. For example, polar encoding may increase the likelihood that the information bits are successfully received at the other wireless device since each encoded bit may provide additional information for decoding one or more other encoded bits.

SUMMARY

The described techniques relate to improved methods, systems, devices, and apparatuses that support polar codes over time-varying channels. Wireless devices may employ enhanced polar HARQ techniques for performing retransmissions of polar encoded data. For example, a transmitting device may generate a first set of encoded bits by encoding information bits using a polar code of a first size (e.g., N) and transmit the first set of encoded bits to a receiving device. After determining that the receiving device failed to decode the encoded bits, the transmitting device may generate a second set of encoded bits by encoding the information bits using a polar code of a second size (e.g., 2N). In some cases, the transmitting device may use the first set of encoded bits and one or more copied information bits to generate the second set of encoded bits. The transmitting device may transmit the second set of encoded bits to the receiving device. In aspects of the present disclosure, the one or more copied information bits may depend in part on one or more updated channel quality metrics. For example, channel information associated with transmission of the first set of encoded bits may be compared to channel information associated with transmission of the second set of encoded bits, and the one or more copied information bits may be based at least in part on a result of the comparison. By way of example, a number of bits in the copied information bits may increase as the difference between the two channel metrics decreases. Considerations for obtaining such metrics, determining a number of copied information bits based on the metrics, and communicating (e.g., or inferring) the number of copied information bits are discussed below, among other considerations.

A method of wireless communication is described. The method may include receiving a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels, transmitting, to the device, an indication that a decoding of the first set of encoded bits was unsuccessful, receiving a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and obtaining the information bit vector by decoding the first and second sets of encoded bits.

An apparatus for wireless communication is described. The apparatus may include a processor, memory in electronic communication with the processor, and instructions stored in the memory. The instructions may be executable by the processor to cause the apparatus to receiving a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels, transmitting, to the device, an indication that a decoding of the first set of encoded bits was unsuccessful, receiving a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and obtaining the information bit vector by decoding the first and second sets of encoded bits.

Another apparatus for wireless communication is described. The apparatus may include receiving a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels, transmitting, to the device, an indication that a decoding of the first set of encoded bits was unsuccessful, receiving a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and obtaining the information bit vector by decoding the first and second sets of encoded bits.

A non-transitory computer-readable medium storing code for wireless communication is described. The code may include instructions executable by a processor to receiving a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels, transmitting, to the device, an indication that a decoding of the first set of encoded bits was unsuccessful, receiving a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and obtaining the information bit vector by decoding the first and second sets of encoded bits.

Some examples of the method, apparatuses, and non-transitory computer-readable medium described herein may further include operations, features, means, or instructions for determining a number of bits in the at least one bit of the information bit vector.

In some examples of the method, apparatuses, and non-transitory computer-readable medium described herein, determining the number of bits in the at least one bit of the information bit vector may include operations, features, means, or instructions for performing a density evolution operation on the second polar code based on the channel metric.

In some examples of the method, apparatuses, and non-transitory computer-readable medium described herein, determining the number of bits in the at least one bit of the information bit vector may include operations, features, means, or instructions for identifying the number of bits in a look-up table based on the channel metric.

In some examples of the method, apparatuses, and non-transitory computer-readable medium described herein, determining the number of bits in the at least one bit of the information bit vector may include operations, features, means, or instructions for determining a magnitude of a difference between the channel metric and an initial channel metric measured prior to the receiving the first set of encoded bits.

Some examples of the method, apparatuses, and non-transitory computer-readable medium described herein may further include operations, features, means, or instructions for determining a respective coded bit metric for each bit of the second set of encoded bits based on the channel metric and a modulation order for the second set of encoded bits, where the number of bits may be based on the respective coded bit metrics.

Some examples of the method, apparatuses, and non-transitory computer-readable medium described herein may further include operations, features, means, or instructions for transmitting channel feedback to the device over the wireless channel after the receiving the first set of encoded bits, the channel feedback including the channel metric, an initial channel metric measured prior to the receiving the first set of encoded bits, a magnitude of a difference between the channel metric and the initial channel metric, or a combination thereof.

Some examples of the method, apparatuses, and non-transitory computer-readable medium described herein may further include operations, features, means, or instructions for measuring the channel metric subsequent to the receiving the first set of encoded bits.

Some examples of the method, apparatuses, and non-transitory computer-readable medium described herein may further include operations, features, means, or instructions for receiving, from the device, a trigger to provide channel feedback, where the trigger may be received after the indication that the first set of encoded bits was unsuccessful and prior to the receiving the second set of encoded bits.

Some examples of the method, apparatuses, and non-transitory computer-readable medium described herein may further include operations, features, means, or instructions for receiving, in a control transmission scheduling the second set of encoded bits, an indication of the channel metric or a number of bits in the at least one bit of the information bit vector.

In some examples of the method, apparatuses, and non-transitory computer-readable medium described herein, the channel metric includes a SNR, a channel quality indicator (CQI), a reference signal received power (RSRP), a reference signal received quality (RSRQ), or a combination thereof.

In some examples of the method, apparatuses, and non-transitory computer-readable medium described herein, the first set of encoded bits includes a subset of encoded bits of a codeword generated by the first polar code.

In some examples of the method, apparatuses, and non-transitory computer-readable medium described herein, the second set of encoded bits includes a second subset of encoded bits of a second codeword generated by the second polar code.

In some examples of the method, apparatuses, and non-transitory computer-readable medium described herein, the second set of encoded bits may have a same bit length as the first set of encoded bits.

In some examples of the method, apparatuses, and non-transitory computer-readable medium described herein, the second set of encoded bits may have a different bit length from the first set of encoded bits.

A method of wireless communication is described. The method may include generating a first set of encoded bits by mapping an information bit vector to a first set of polarized bit channels of a first polar code according to a first bit index set, the first bit index set being based on respective bit channel reliabilities of the first set of polarized bit channels, transmitting the first set of encoded bits to a device over a wireless channel, receiving, from the device, an indication that a decoding of the first set of encoded bits was unsuccessful, generating a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and transmitting the second set of encoded bits to the device over the wireless channel.

An apparatus for wireless communication is described. The apparatus may include a processor, memory in electronic communication with the processor, and instructions stored in the memory. The instructions may be executable by the processor to cause the apparatus to generating a first set of encoded bits by mapping an information bit vector to a first set of polarized bit channels of a first polar code according to a first bit index set, the first bit index set being based on respective bit channel reliabilities of the first set of polarized bit channels, transmitting the first set of encoded bits to a device over a wireless channel, receiving, from the device, an indication that a decoding of the first set of encoded bits was unsuccessful, generating a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and transmitting the second set of encoded bits to the device over the wireless channel.

Another apparatus for wireless communication is described. The apparatus may include generating a first set of encoded bits by mapping an information bit vector to a first set of polarized bit channels of a first polar code according to a first bit index set, the first bit index set being based on respective bit channel reliabilities of the first set of polarized bit channels, transmitting the first set of encoded bits to a device over a wireless channel, receiving, from the device, an indication that a decoding of the first set of encoded bits was unsuccessful, generating a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and transmitting the second set of encoded bits to the device over the wireless channel.

A non-transitory computer-readable medium storing code for wireless communication is described. The code may include instructions executable by a processor to generating a first set of encoded bits by mapping an information bit vector to a first set of polarized bit channels of a first polar code according to a first bit index set, the first bit index set being based on respective bit channel reliabilities of the first set of polarized bit channels, transmitting the first set of encoded bits to a device over a wireless channel, receiving, from the device, an indication that a decoding of the first set of encoded bits was unsuccessful, generating a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and transmitting the second set of encoded bits to the device over the wireless channel.

Some examples of the method, apparatuses, and non-transitory computer-readable medium described herein may further include operations, features, means, or instructions for determining a number of bits in the at least one bit of the information bit vector.

In some examples of the method, apparatuses, and non-transitory computer-readable medium described herein, determining the number of bits in the at least one bit of the information bit vector may include operations, features, means, or instructions for performing a density evolution operation on the second polar code based on the channel metric.

In some examples of the method, apparatuses, and non-transitory computer-readable medium described herein, determining the number of bits in the at least one bit of the information bit vector may include operations, features, means, or instructions for identifying the number of bits in a look-up table based on the channel metric.

In some examples of the method, apparatuses, and non-transitory computer-readable medium described herein, determining the number of bits in the at least one bit of the information bit vector may include operations, features, means, or instructions for determining a magnitude of a difference between the channel metric and an initial channel metric measured prior to the receiving the first set of encoded bits.

Some examples of the method, apparatuses, and non-transitory computer-readable medium described herein may further include operations, features, means, or instructions for determining a respective coded bit metric for each bit of the second set of encoded bits based on the channel metric and a modulation order for the second set of encoded bits, where the number of bits may be based on the respective coded bit metrics.

Some examples of the method, apparatuses, and non-transitory computer-readable medium described herein may further include operations, features, means, or instructions for receiving channel feedback from the device over the wireless channel after the transmitting the first set of encoded bits, the channel feedback including the channel metric, an initial channel metric measured prior to the transmitting the first set of encoded bits, a magnitude of a difference between the channel metric and the initial channel metric, or a combination thereof.

Some examples of the method, apparatuses, and non-transitory computer-readable medium described herein may further include operations, features, means, or instructions for measuring the channel metric subsequent to the transmitting the first set of encoded bits.

Some examples of the method, apparatuses, and non-transitory computer-readable medium described herein may further include operations, features, means, or instructions for transmitting, to the device, a trigger to provide channel feedback, where the trigger may be transmitted after the indication that the first set of encoded bits was unsuccessful and prior to the transmitting the second set of encoded bits.

Some examples of the method, apparatuses, and non-transitory computer-readable medium described herein may further include operations, features, means, or instructions for transmitting, in a control transmission scheduling the second set of encoded bits, an indication of the channel metric or a number of bits in the at least one bit of the information bit vector.

In some examples of the method, apparatuses, and non-transitory computer-readable medium described herein, the channel metric includes a SNR, a CQI, a RSRP, a RSRQ, or a combination thereof.

In some examples of the method, apparatuses, and non-transitory computer-readable medium described herein, the first set of encoded bits includes a subset of encoded bits of a codeword generated by the first polar code.

In some examples of the method, apparatuses, and non-transitory computer-readable medium described herein, the second set of encoded bits includes a second subset of encoded bits of a second codeword generated by the second polar code.

In some examples of the method, apparatuses, and non-transitory computer-readable medium described herein, the second set of encoded bits may have a same bit length as the first set of encoded bits.

In some examples of the method, apparatuses, and non-transitory computer-readable medium described herein, the second set of encoded bits may have a different bit length from the first set of encoded bits.

DETAILED DESCRIPTION

Figure 1:
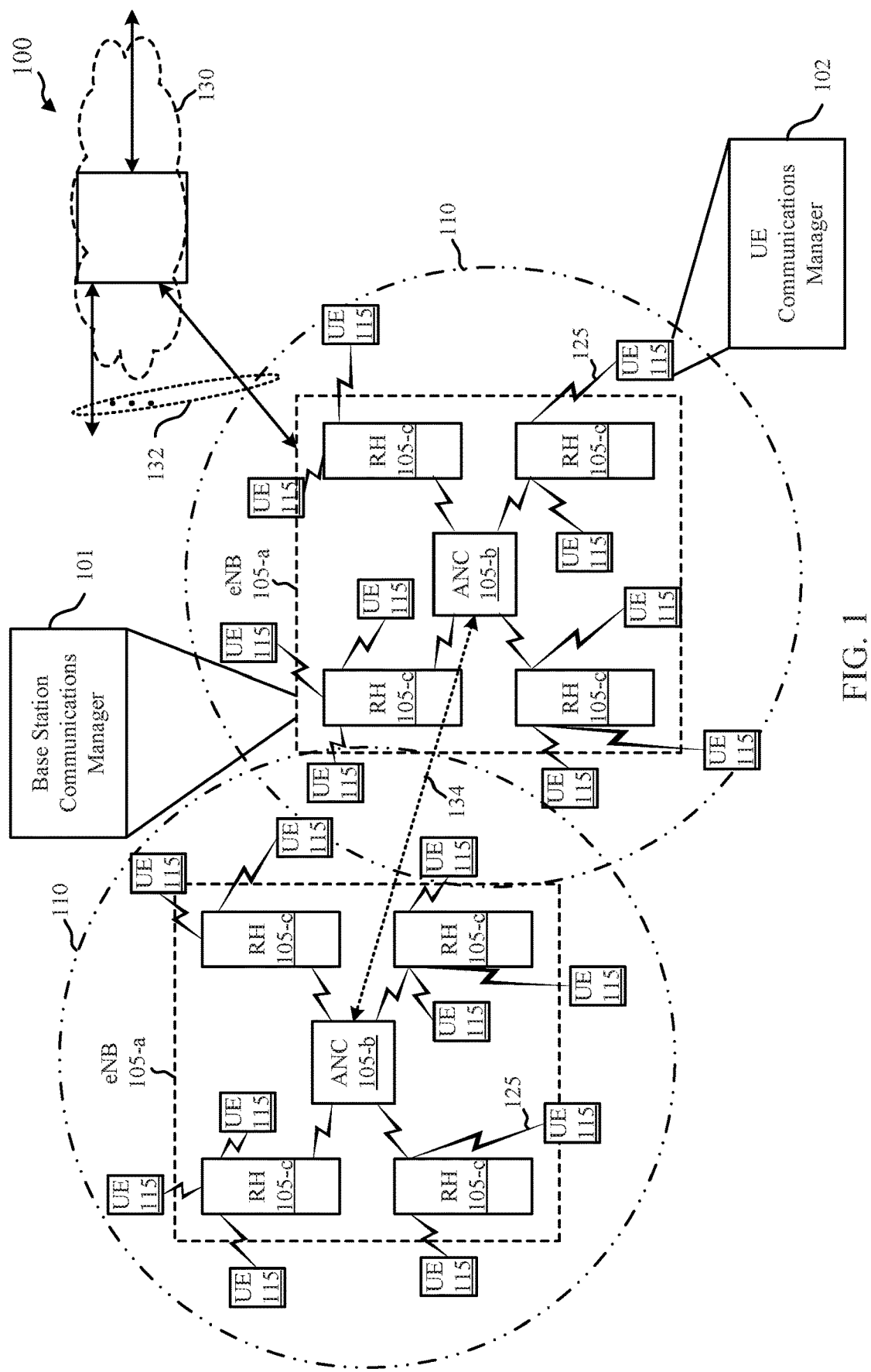
FIG. 1 illustrates an example of a wireless communications system that supports polar codes over time-varying channels in accordance with aspects of the present disclosure.

Polar encoding may be used in combination with a hybrid automatic repeat request (HARQ) operation (or "polar HARQ operation") to increase the reliability of data transmissions over a wireless transmission link. Polar encoding is a channel-dependent coding technique, and combined with a HARQ operation, channel differences between transmissions can result in decoding errors. A polar HARQ operation may include encoding information bits using a polar code to generate a first codeword of a first size and transmitting a first set of encoded bits including at least a portion of the first codeword. Based on a decoding failure associated with the first codeword (e.g., which may be signaled as feedback from the decoder to the transmitting device), redundant information may be transmitted to assist the receiving device in decoding the information bits. That is, the polar HARQ operation may further include encoding the information bits using a second polar code to generate a second codeword of a second (e.g., larger) size and transmitting a second set of encoded bits including at least a portion of the second codeword. The likelihood of decoding information bits encoded with a larger polar code (e.g., size 2N compared to N) may be greater than the likelihood of decoding information encoded with a smaller polar code (e.g., size N). In some cases, wireless devices may employ enhanced polar HARQ operation techniques for performing retransmissions of polar encoded data over time-varying channels. A time-varying channel is a channel whose channel conditions may change over time.

In one example, a transmitting device encodes information bits for a receiving device using a first polar code of a first size (e.g., N), yielding a first set of encoded bits. To provide coding gain, the number of encoded bits may be greater than the number of information bits. The transmitting device may transmit the first set of encoded bits to the receiving device. In some cases, the receiving device receives the first set of encoded bits but fails to successfully decode the information bits. The receiving device may indicate the decoding failure to the transmitting device, which may then prepare a retransmission.

The transmitting device may generate a second set of encoded bits for the retransmission using a second polar code. The second polar code may be of the first size (e.g., N) or may be of a different size. In some cases, the second set of encoded bits may be based at least in part on the first set of encoded bits. For example, the transmitting device may assign known (or "frozen") bits to polarized bit channels of the second polar code and may exclusive-or (XOR) the first set of encoded bits with the output of the second polar code. In some cases, the first and second sets of encoded bits together may be considered as making up a second codeword.

The transmitting device may transmit the second set of encoded bits to the receiving device, which may receive the second set of encoded bits and decode the information bits using both the received first set of encoded bits and the received second set of encoded bits. As discussed above, the likelihood of decoding information bits encoded using a larger polar code may be higher than if the information bits were encoded using a smaller polar code. Thus, the receiving device may in some cases successfully decode the second codeword. In other cases, the receiving device may fail to decode the second codeword, in which case, the transmitting device may similarly generate a third set encoded bits and a third codeword may be understood as including the first set of encoded bits, the second set of encoded bits, and the third set of encoded bits (e.g., with an effective polar code size of 4N). More generally, the effective polar code size for a retransmission may be represented as $2^{(ceil(log_2(N_1+N_2+N_3+\ldots+N_n)))}$ where $N_1$ represents the number of encoded bits generated by the first polar code, $N_2$ represents the number of encoded bits generated by the second polar code, and so on. In some cases, the third set of encoded bits may be based at least in part on the first set of encoded bits and/or the second set of encoded bits.

In some examples, the transmitting device may copy one or more of the information bits to the polarized bit channels of the second polar code when generating the second set of encoded bits. For instance, the transmitting device may copy an information bit to a polarized bit channel of the second polar code if a reliability of the polarized bit channel (based on bit channel reliability of the second polar code) is greater than a reliability of a polarized bit channel used by the information bit for the first transmission. In some cases, the transmitting device may copy information bits to the polarized bit channels of the second polar code such that the retransmission is self-decodable. For example, polarized bit channels for the retransmission may be selected to carry information bits based on which polarized bit channels carried information bits for the first transmission and the block size of the first transmission.

In accordance with aspects of the present disclosure, the number of copied bits for the retransmission may be based at least in part on channel conditions associated with the initial transmission and/or the retransmission. For example, the transmitting device (e.g., or the receiving device) may determine updated channel conditions (e.g., signal to noise ratio (SNR)) for the wireless channel after the initial transmission and before the retransmission, and one or more parameters of the copied information bits (e.g., a number of copied information bits, a bit channel of the second polar code to be used for a copied information bit, etc.) may depend on the updated channel conditions. In some cases, the devices may identify a difference in channel conditions for the wireless channel between the initial transmission and the retransmission. Considerations for determining the difference in channel conditions, identifying a number of information bits, and other techniques supporting polar codes over time-varying channels are discussed below.

Techniques described herein compensate for or prevent the performance loss when there is a large bit SNR difference between transmissions in polar coded HARQ schemes. Techniques described herein may use parameters determined based on channel measurement values to reduce this performance loss. Because wireless channels tend to have symmetry, in some examples, the parameters of the polar coded HARQ scheme can be alternatively determined based on the difference values of the channel measurements. The techniques described herein improve performance of wireless devices, including reducing decoding errors and improving user performance.

Aspects of the disclosure are initially described in the context of a wireless communications system. Aspects of the disclosure are further illustrated by and described with reference to apparatus diagrams, system diagrams, and flowcharts that relate to polar codes over time-varying channels.

FIG. 1 illustrates an example of a wireless communications system 100 that supports polar codes over time-varying channels in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use HARQ to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30{,}720{,}000$ seconds. Time intervals of a communications resource may be organized according to radio frames each having a duration of 10 milliseconds (ms), where the frame period may be expressed as $T_f=307{,}200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

A transmitting device (e.g., a base station 105 or a UE 115) may generate a first codeword of size N using a polar code, the first codeword including a first set of encoded bits. The transmitting device may transmit the first codeword to a receiving device (e.g., a UE 115 or base station 105). The transmitting device may determine that the first codeword was not successfully received and prepare a retransmission according to a polar HARQ operation. The transmitting device may generate a second codeword (e.g., including or based on the first set of encoded bits and a second set of encoded bits). In some cases, the transmitting device may copy information bits of the first codeword to the polarized bit channels of the second polar code when generating the second set of encoded bits. The copied information bits may be based at least in part on updated channel conditions of the wireless channel supporting communications between the two devices. A base station 105-$a$ may include a base stations communications manager 101 that may perform some or all of the techniques described herein. A UE 115 may include a UE communications manager 102 that may likewise perform some or all of the techniques described herein.

Figure 2:
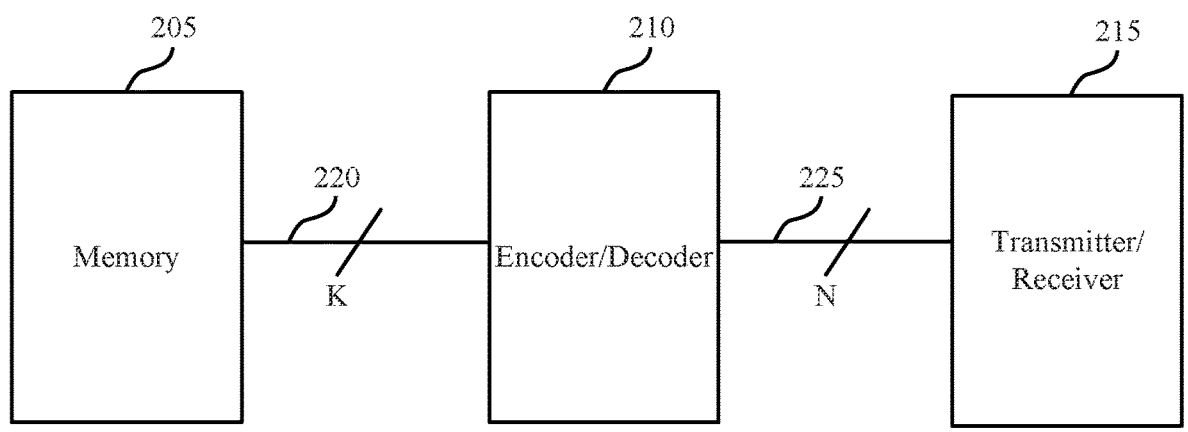
FIG. 2 illustrates an example of a device that supports polar codes over time-varying channels in accordance with aspects of the present disclosure.

FIG. 2 illustrates an example of a device 200 that supports polar codes over time-varying channels in accordance with aspects of the present disclosure. In some examples, device 200 may implement aspects of wireless communications system 100. Device 200 may be any device within a wireless communications system 100 that performs an encoding or decoding process (e.g., using an error-correcting code, such as a polar code). Device 200 may be an example of a UE 115 or a base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some cases, device 200 may have data stored in memory 205 to be transmitted to another device, such as a UE 115 or a base station 105. To initiate the transmission process, device 200 may retrieve the data for transmission from memory 205. The data may include a number of payload bits, 'A,' which may be 1s or 0s, provided from memory 205 to encoder/decoder 210 via first bus 220. In some cases, these payload bits may be combined with a number of parity or error checking bits, 'E,' to form a total set of information bits, 'A+E.' The number of information bits may be represented as a value 'K,' as shown (e.g., K=A+E). The encoder/decoder 210 may implement a polar code with a block length, 'N,' for encoding the information bits, where N may be different than or the same as K. Such a polar code may be referred to as an (N, K) polar code. In some cases, the bits that are not allocated as information bits (e.g., N–K bits) may be assigned as frozen bits.

In some cases, to perform a polar coding operation, encoder 210 may generate a codeword of length 'M,' where M is a power of 2 (i.e., M=$2^m$ where m is an integer value). If N is not a power of 2, encoder 210 may round the value of N up to the nearest valid M value. For example, if N=400, encoder 210 may determine a codeword length of M=512 (e.g., the nearest valid value for M greater than or equal to N, and wherein m=9) in order to support polar coding. In these cases, encoder 210 may encode a codeword of length M, and then may puncture a number of bits M−N (e.g., remove the bits) to obtain a codeword of the specified block length N for transmission.

Encoder 210 may attempt to assign the information bits to the K most reliable bit channels and the frozen bits to the remaining bit channels. Encoder/decoder 210 may employ various techniques for determining or estimating the K most reliable bit channels. For example, encoder/decoder 210 may implement fractal enhanced kernel (FRANK) polar code construction, polarization-weight (PW), generator weight (GW), density evolution (DE), or a combination of these techniques. In some cases, encoder/decoder 210 may employ look-up-tables that provide bit-channel reliability based on various combinations of N, M, and K. Encoder 210 may determine information bit channels based on the determined bit-channel reliability, and may assign frozen bits to the remaining bit-channels. Frozen bits may be bits of a default value (e.g., 0, 1, etc.) known to both the encoder and decoder (i.e., the encoder encoding information bits at a transmitter and the decoder decoding the codeword received at a receiver). Further, from the receiving device perspective, device 200 may receive a data signal representing the codeword via receiver 215, and may decode the signal using decoder 210 to obtain the transmitted data.

In some wireless systems, decoder 210 may be an example of a successive cancellation (SC) or a successive cancellation list (SCL) decoder. A UE 115 or a base station 105 may receive a transmission including a codeword (e.g., symbol information representing the unpunctured bits of the codeword) at receiver 215, and may send the transmission to the SCL decoder (e.g., decoder 210). The SCL decoder may determine input logarithmic-likelihood ratios (LLRs) for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics, and may output the bits corresponding to the selected decoding path as the decoded sets of bits. For example, the SCL decoder may select the decoding paths with the highest path metrics for error checking, and may determine a successfully decoded path candidate based on a result of the error checking process.

If an SCL decoder determines that the first number of bits are all frozen bits, the SCL decoder may determine that the correct decoding path for the first number of bits must be the default frozen bit values (e.g., if the default frozen bit value is 0, the correct decoding path for the first number of bits must be all 0's). Once the SCL decoder reaches the first information bit, the SCL decoder may begin performing operations to decode the rest of the bits of the codeword, as the SCL decoder may not be able to determine the correct decoding path from the first information bit onwards (e.g., because the first information bit may be a 0 or a 1). However, the SCL decoder may still determine bit metrics for the bit channels containing frozen bits, and may use these bit metrics when calculating path metrics for the decoding path candidates. For example, the SCL decoder may update the path metric for the decoding candidates after every bit, regardless of bit type (e.g., after each frozen bit, payload bit, parity bit, etc.).

Transmitting devices and receiving devices, such as base stations 105 and UEs 115, may use polar coding to increase the reliability of a communications link. The transmitting devices and receiving devices may also use HARQ operations to increase the reliability of a communications link. HARQ operation may include retransmitting (at least partially) encoded information for the information bits one or more times, allowing a receiving device to perform successive decoding operations. Each decoding operation may provide the receiving device with additional information for decoding and increase the likelihood of a successful decoding of the encoded information.

In some examples, transmitting devices and receiving devices may use polar coding in combination with HARQ operations to further increase the reliability of a communications link. As discussed above, polar codes approach the theoretical channel capacity as the code length increases, and each retransmission for a HARQ operation may effectively increase the code length of a data transmission. That is, a first transmission may be associated with a first codeword of a first size N. A first retransmission may be associated with a second codeword of a second size 2N. A second retransmission may be associated with a third codeword of a third size (e.g., 4N), and so on. Thus, the likelihood of decoding each successive codeword may increase.

As described above, each sub-channel, or polarized bit-channel, of a polar code may be associated with a reliability, and the reliability of some sub-channels may be higher than others. In the context of HARQ operations, a first set of sub-channels of the effective polar code used to generate the first codeword may have first reliabilities and a second set of sub-channels of the effective polar code used to generate the second codeword may have second reliabilities. In some cases, the first and second reliabilities are based on channel conditions and/or transmission parameters. The reliabilities of some of the second sub-channels may be improved relative to the first reliabilities of the first sub-channels, and the relative reliabilities may vary if channel conditions change or if different transmission parameters (e.g., different modulation) are used for the first retransmission.

In some cases, a transmitting device may copy one or more information bits used to generate the first codeword to the second sub-channels. In some cases, the information bits may be copied from some of the first set of sub-channels to some of the second set of sub-channels based at least in part on updated channel conditions of the wireless channel supporting communications between the devices. For example, a number of copied information bits, a composition of the second set of sub-channels, or the like may be based at least in part on updated channel conditions of the wireless channel.

Figure 3:
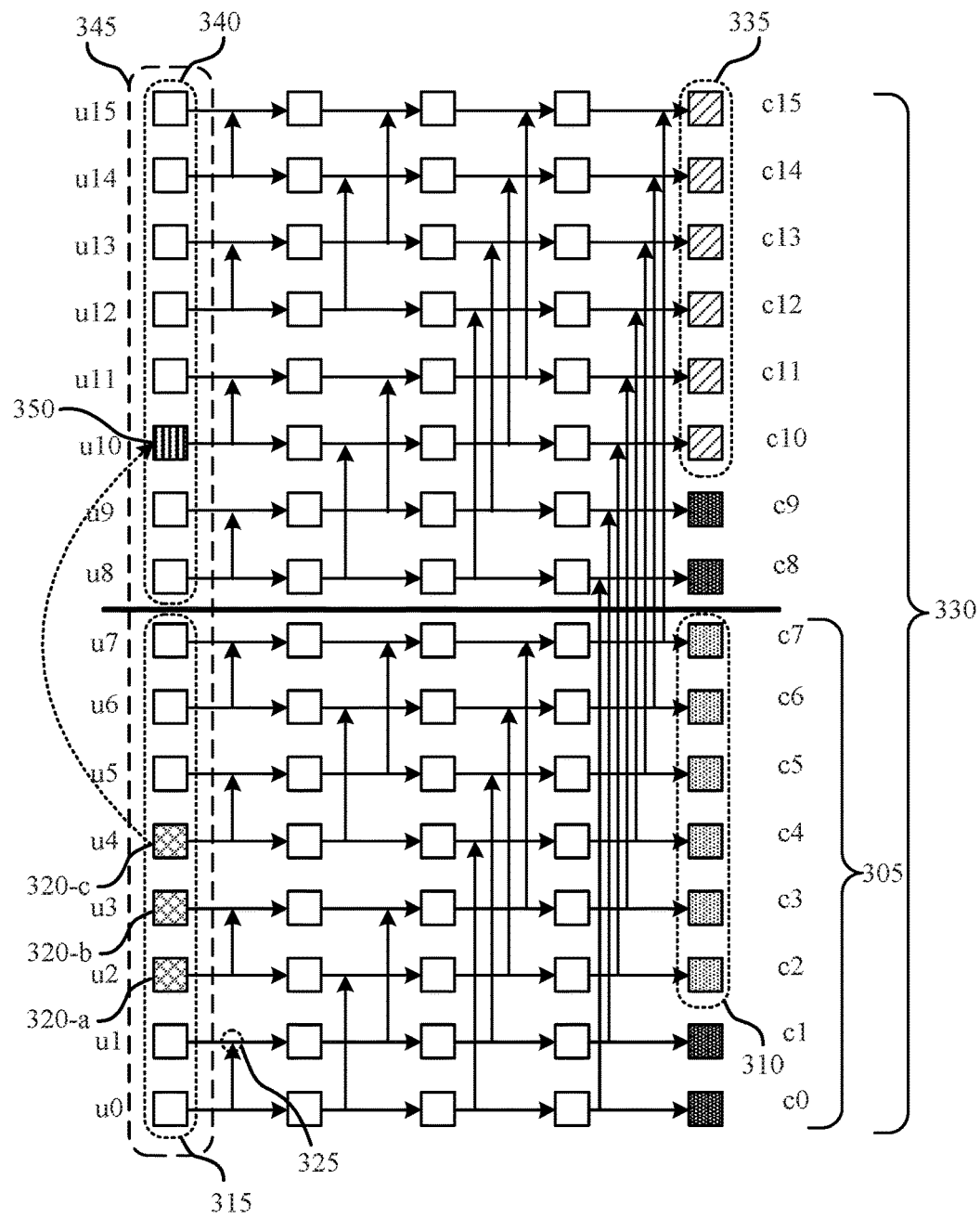
FIG. 3 illustrates an example of an encoding scheme that supports polar codes over time-varying channels in accordance with aspects of the present disclosure.

FIG. 3 illustrates an example of an encoding scheme 300 that supports polar codes over time-varying channels in accordance with aspects of the present disclosure. Encoding scheme 300 may illustrate aspects of a transmission between a UE 115 and a base station 105, as described above with reference to FIGS. 1 and 2. Encoding scheme 300 may include first codeword 305 and second codeword 330. First codeword 305 may be composed of first encoded bits 310, which may be generated using first polarized bit channels 315, information bits 320-$a$, 320-$b$, 320-$c$, and XOR operations 325. Second codeword 330 may be composed of first encoded bits 310 and second encoded bits 335, which may be generated using second polarized bit channels 340, XOR operations 325, first encoded bits 310, and one or more copied information bits 350. In some cases, second codeword 330 may be considered as being generated using combined polarized bit channels 345 of a second polar code of length 2N, which includes both first polarized bit channels 315 and second polarized bit channels 340.

A transmitting device may encode information bits 320-$a$ to 320-$c$ to obtain first encoded bits 310 using a polar code of size N, and may prepare a retransmission of second encoded bits 335 using a second polar code of effective size 2N and first encoded bits 310. As shown, the transmitting device may use a block length of M=6, so the transmitting device may round up to generate the first codeword 305 of size N=8, and puncture two bits of the encoded bits 310 (i.e., corresponding to punctured bits 355) to generate a codeword of the block length M Puncturing bits removes those bits from the encoded bit stream or codeword.

The transmitting device generates the first codeword 305, including the first encoded bits 310 and punctured bits 355, by identifying the K most reliable bit channels of the N bit channels in the first polarized bit channels 315. In the example of FIG. 3, K=3, M=6, and N=8. In some examples, information bit allocation may be determined based on PW, GW, DE, and/or FRANK channel reliability estimation. In some cases, information bits 320-$a$, 320-$b$, and 320-$c$ are mapped to the most reliable bit channels of the first polarized bit channels 315 (e.g., bit channels 3, 4, and 5, respectively). The K bit channels selected for information bits of the first polarized bit channels 315 may be referred to as a first set of bit channels, A. As described, A={$i_0$, $i_1$, ..., $i_{K-1}$}, 0≥$i_j$<N are the indices set of the information bits in the U-domain, where the corresponding payloads are denoted as {$u_0$, $u_1$, ..., $u_{K-1}$}. In the U-domain, $u_8$=[ 0, 0, 0, $u_0$, $u_1$, $u_2$, 0, 0], where $u_8$ corresponds to the 8 bit channels in the first polarized bit channels 315, showing that information bits are on bit channels 3, 4, and 5. The transmitting device may generate first codeword 305 of size N=8, and puncture two bits to generate a codeword of length M=6. First codeword 305 may be referred to as $C_1$. The transmitting device may generate first codeword 305 according to a generator matrix, G, where $C_1$=uG. The transmitting device may then transmit the first six bits of $C_1$ (e.g., corresponding to M, the block length) to a receiving device.

The receiving device may not successfully decode first encoded bits 310. In some cases, the receiving device may indicate the failure (e.g., in a negative acknowledgment) to the transmitting device. In some other examples, the transmitting device may not receive feedback for first encoded bits 310, as they were not successfully received by the receiving device (e.g., due to interference, etc.). The transmitting device may transmit second encoded bits 335 to the receiving device in a retransmission. The receiving device may receive second encoded bits 335 and may combine second encoded bits 335 with first encoded bits 310 to create second codeword 330. The receiving device may have a higher likelihood of decoding second codeword 330 since each received bit in a polar coded transmission may provide additional information for decoding another bit.

The transmitting device may in some cases determine one or more copied information bits 350 based on an updated channel condition metric. For example, the transmitting device may determine a number of the one or more copied information bits 350 (e.g., and/or one or more bit channels within second polarized bit channels 340 for the copied information bits 350) based on the updated channel condition metric. In some cases, the one or more bit channels within second polarized bit channels 340 for copied information bits 350 may be determined based on reliability comparison (e.g., as the number of bit-channels within second polarized bit channels 340 that have a greater reliability than at least one bit-channel within first polarized bit-channels 315, as determined based on the second polar code). However, other techniques may be used such as a progressive matching (e.g., progressively matching bit-channels within the second polarized bit channels 340 in decreasing order of reliability with bit-channels having a lowest reliability, or a highest reliability lower than the progressively matched bit-channel, in some cases), or self-decodable redundancy version bit copying. Additionally or alternatively, the determination may be based on a difference between the updated channel condition metric and a previous channel condition metric (e.g., a channel condition metric determined prior to transmission of first codeword 305). In some examples, the determination may be made based at least in part on an absolute difference value between channel measurements of a current transmission and that of one or more (e.g., all) previous transmissions.

Figure 4:
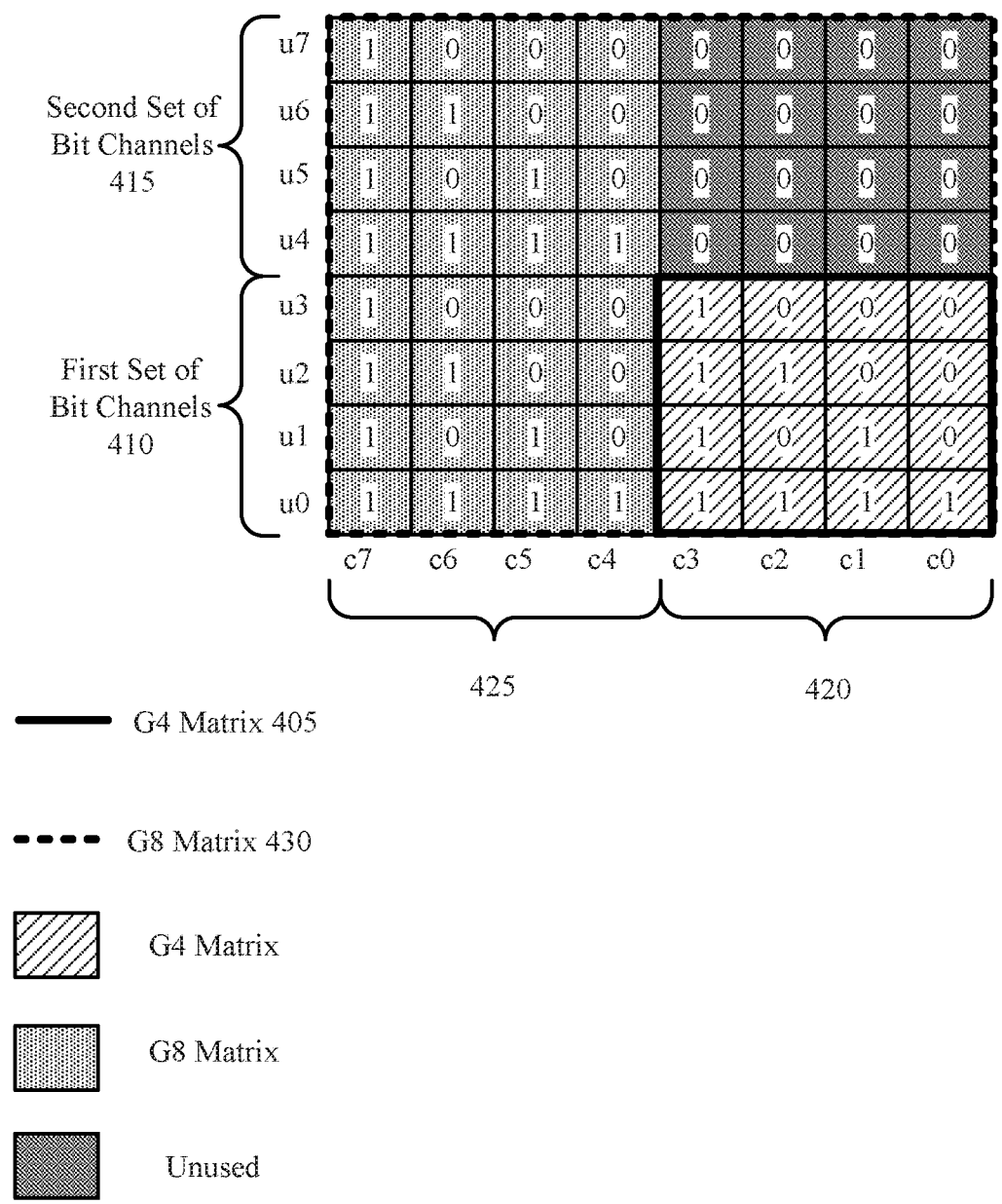
FIG. 4 illustrates an example of generator matrices that support polar codes over time-varying channels in accordance with aspects of the present disclosure.

FIG. 4 illustrates an example of generator matrices 400 that support polar codes over time-varying channels in accordance with aspects of the present disclosure. In some examples, generator matrices 400 may implement aspects of wireless communications system 100.

Generator matrices 400 may include a $G_4$ matrix 405 ("G4"), which is a generator matrix for codewords of 4 bits, and a $G_8$ matrix ("G8"), which is a generator matrix for codewords of 8 bits. A transmitting device as described herein may be capable of using a variety of different generator matrices 400. The transmitting device may apply puncturing if a size of the generator matrix is not a square of 2.

A transmitting device may generate a first transmission of a first set of coded bits 420 using the $G_4$ matrix 405. First set of coded bits 420, corresponding to $c_0$ through $c_3$, may be based on a first set of bit channels 410, corresponding to $u_0$ through $u_3$. For a column of a coded bit, if there is a "1" in a row corresponding to a bit channel, that bit channel is used in determining the coded bit. For example, $c_0$ is based on bit channel $u_0$, $c_1$ is based on bit channels $u_0$ and $u_1$, $c_2$ is based on bit channels $u_0$ and $u_2$, and $c_3$ is based on bit channels $u_0$, $u_1$, $u_2$, and $u_3$.

The transmitting device may allocate information bits to the bit channels. In some cases, the information bits may be allocated based on techniques such as PW, GW, DE, or FRANK bit-channel reliability estimation. The first transmission may have three information bits. A first information bit may be assigned to $u_0$, a second information bit may be assigned to $u_1$, and a third information bit may be assigned to $u_2$. A frozen bit may be assigned to the fourth bit channel, $u_3$. The transmitting device may transmit a second set of coded bits 425 as a retransmission. Second set of coded bits 425 may be generated using the G8 matrix 430. Second set of coded bits 425 may be generated based on first set of bit channels 410 and second set of bit channels 415. For example, $c_4$ may be based on $u_0$ and $u_4$, and so on.

In some cases, the transmitting device may copy an information bit from the first transmission to the second transmission. For example, the information bit assigned to $u_2$ may also be assigned to information bit $u_4$. In some cases, other bit channels in second set of bit channels 415 may be assigned frozen bits (e.g., known values of 0 or 1). A generator matrix for a code length N, $G_N$, may be used to determine a generator matrix for a code length 2N. For example, $$G_{2N} = \begin{bmatrix} G_N & 0 \\ G_N & G_N \end{bmatrix}.$$

As shown, if $G_4$ is the 4×4 matrix in the bottom right quadrant, it is duplicated in the bottom left quadrant and top left quadrant of the $G_8$ matrix, and a 4×4 zero matrix occupies the top right quadrant of the $G_8$ matrix. In this way, the first set of coded bits has zeroes occupy the corresponding rows for the second set of bit channels 415.

Figure 5:
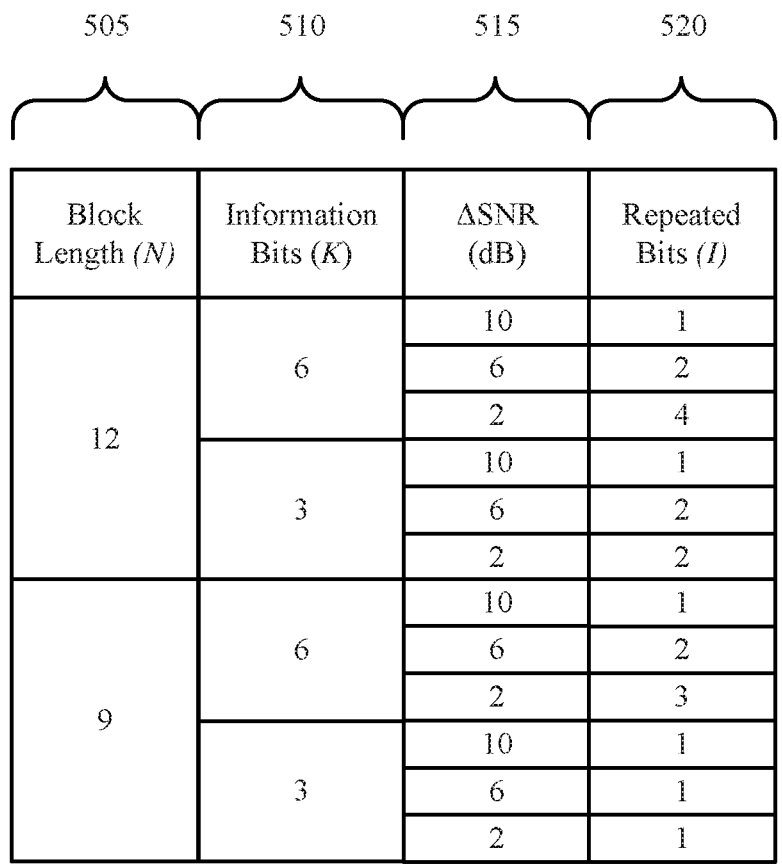
FIG. 5 illustrates an example repetition table that supports polar codes over time-varying channels in accordance with aspects of the present disclosure.
Figure 5:
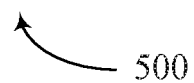

FIG. 5 illustrates an example repetition table 500 that supports polar codes over time-varying channels in accordance with aspects of the present disclosure. In some examples, repetition table 500 may implement aspects of wireless communications system 100. It is to be understood that the numbers discussed with reference to repetition table 500 are included for the sake of explanation and are not limiting of scope. In some cases, repetition table 500 may be referred to as a lookup table. That is, one or more communicating devices (e.g., the transmitting device and/or receiving device) may have access to repetition table 500 (e.g., may be configured with repetition table 500) and may perform aspects of the present disclosure based on repetition table 500.

Repetition table 500 includes a first column 505 relating to a block length N of a codeword (e.g., as described with reference to FIG. 2). Though illustrated as containing two possible block lengths N (e.g., 9 and 12), it is to be understood that repetition table 500 may additionally or alternatively include other block lengths N. Each block length N may be associated with one or more possible information bit vector lengths K (e.g., as illustrated by second column 510). For example, each possible permutation of N and K may be referred to as a (N, K) codeword, as described with reference to FIG. 2.

Each (N, K) codeword may in turn be mapped to a respective set of repeated bits I (illustrated by fourth column 520) based at least in part on a channel metric (e.g., a SNR difference as illustrated by third column 515). For example, some of the information may be selectively repeated and re-encoded in each transmission. Thus, the transmitting or receiving device may be able to determine the number of copied bits I based on known parameters from the first transmission and the SNR difference. The SNR difference may be, for example, a difference in the coded bit metrics (e.g., per coded bit SNR or CQI) between transmissions. Though illustrated as describing a number of repeated bits I, it is to be understood that repetition table 500 may additionally or alternatively include other information (e.g., a bit channel to be used for each of the repeated bit(s) I, a number of repeated bits for first and second retransmissions). Additionally or alternatively, the bit-channel indices for copied bits may be determined from the number of the repeated bits based on reliability (e.g., matching lowest to highest or highest to highest, etc.), or based on other constraints such as self-decodability. Additionally, though described in the context of a SNR difference, it is to be understood that the channel metric described with reference to third column 515 may in some cases be or include one or more other channel metrics (e.g., CQI).

Figure 6:
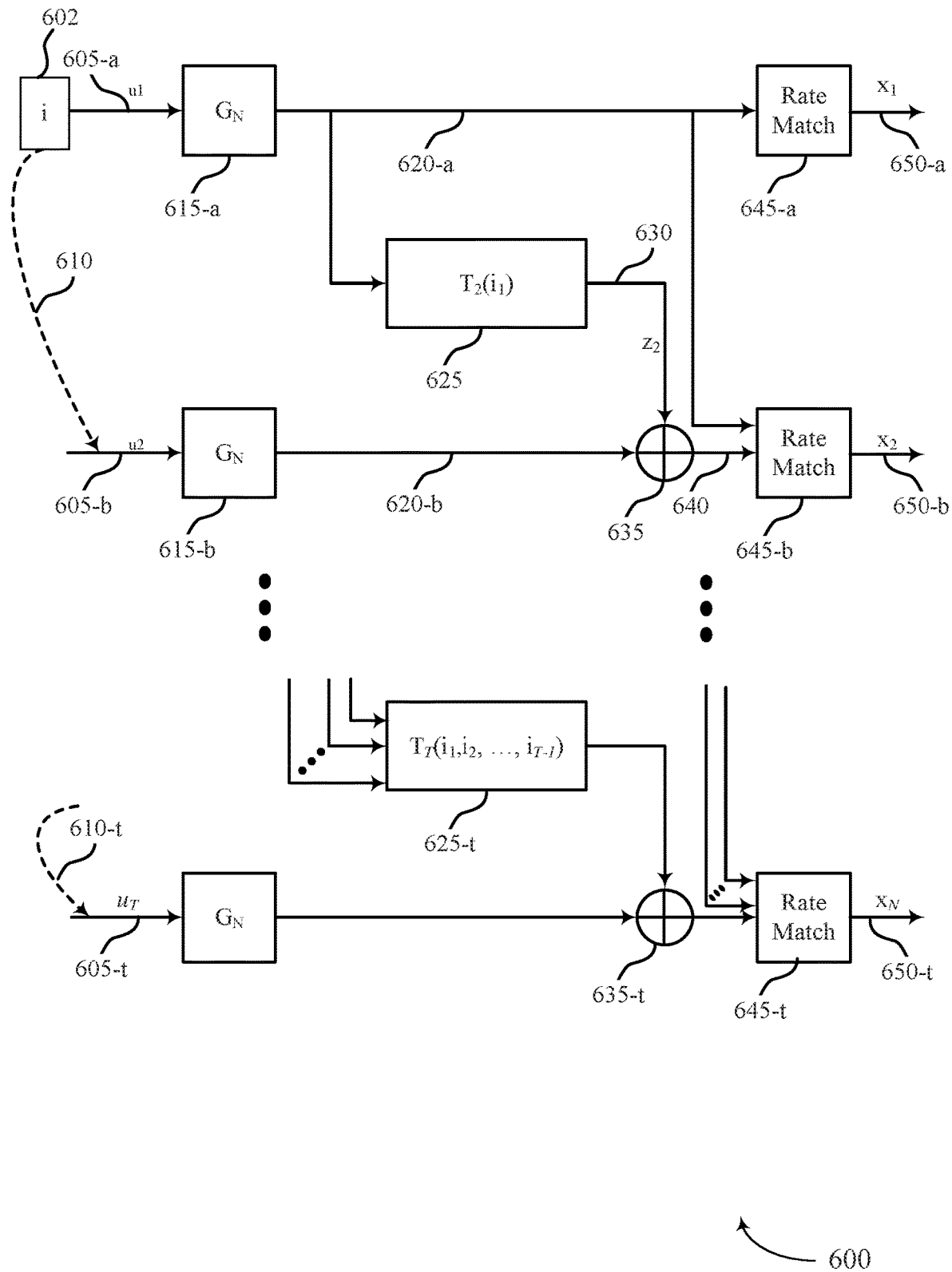
FIG. 6 illustrates an example of an encoding scheme that supports polar codes over time-varying channels in accordance with aspects of the present disclosure.

FIG. 6 illustrates an example of an encoding scheme 600 that supports polar codes over time-varying channels in accordance with aspects of the present disclosure. In some examples, encoding scheme 600 may implement aspects of wireless communications system 100. Though described in the context of encoding, it is to be understood that analogous (e.g., opposite, complementary, etc.) techniques may be performed by a decoder communicating with the device performing encoding scheme 600.

A first information bit vector 602 (e.g., i) may be mapped (along with some number of frozen bits) to a first set of bit-channels 605-a (e.g., $u_1$) and input to a first generator matrix 615-a to produce first output 620-a. The bit locations of the information bits from the first set of bit-channels 605-a may be selected based on bit-channel reliabilities of the first set of bit-channels 605-a as determined by a bit-channel reliability estimating technique (e.g., PW, GW, DE, FRANK, etc.). First output 620-a may in some cases undergo rate matching at 645-a (e.g., to generate a first codeword 650-a having a desired size). First codeword 650-a may be represented as $x_1$. A device may transmit first codeword 650-a to another device and may receive an indication that the other device was unable to successfully decode first codeword 650-a.

In accordance with aspects of the present disclosure, the device may prepare a second codeword 650-b (e.g., $x_2$) for retransmission to the other device. Second codeword 650-b may be prepared based on inputs to a second set of bit-channels 605-b (e.g., $u_2$), which may in turn be based on one or more repetition bits 610 (and one or more frozen bits). As described herein, aspects of repetition bit(s) 610 may be based at least in part on channel conditions associated with transmission of the first codeword 650-a and/or the second codeword 650-b. For example, repetition bit(s) 610 (e.g., the number of repetition bits and/or bit-channel locations) may be determined from updated channel condition information and/or a difference in channel conditions between the first transmission and the second transmission. For example, the number of repetition bits may be determined from a table based on the difference in channel conditions between the first transmission and the second transmission. Alternatively, DE or FRANK bit-channel reliability estimation may be used by the encoder and/or decoder, assigning channel conditions (e.g., per coded bit SNR or CQI) associated with the first transmission to bits of the first codeword 650-a and channel conditions (e.g., per coded bit SNR or CQI) associated with second transmission to bits of the second codeword 650-b. Additionally or alternatively, the bit-channel indices for copied bits may be determined from the number of the repeated bits based on reliability (e.g., matching lowest to highest or highest to highest, etc.), or based on other constraints such as self-decodability.

Second set of bit-channels 605-b may be input to a second generator matrix 615-b (e.g., which may be a same matrix as first generator matrix 615-a) to produce second output 620-b. In some cases, first output 620-a may be transformed at transform 625 according to a transform $T_2$ to produce XOR operand 630 (e.g., $z_2$). Various transforms are considered in accordance with aspects of the present disclosure. As an example, $T_2$ may represent a multiplication by an identity matrix (e.g., such that first output 620-a may be directly XOR'd with second output 620-b). In some cases, $T_2$ may be any binary matrix including a sparse matrix, a permutation matrix, an identity matrix, or combinations thereof.

At 635, second output 620-b may be XOR'd with XOR operand 630 to generate encoded bits 640. Second output 620-b may be understood to be the result of encoding input bits of the first and second sets of bit-channels 605-a and 605-b according to a polar code of length 2N (the polar code comprising the first generator matrix 615-a, the second generator matrix 615-b, and the XOR of the two matrices at 635). Encoded bits 640 may undergo rate matching at rate matching 645-b to produce second codeword 650-b. Though illustrated as using two codewords 650 for the sake of explanation, it is to be understood that encoding scheme 600 may employ any suitable number of codewords 650 (e.g., subject to a HARQ process constraint) without deviating from the scope of the present disclosure. By way of example, a $T^{th}$ codeword 650-t may be based on inputs to a third set of bit-channels 605-t (e.g., including one or more repetition bits 610-t), first output 620-a, second output 620-b, a transform TT 625-t, XOR 635-t, rate-matching 645-t, etc.

Figure 7:
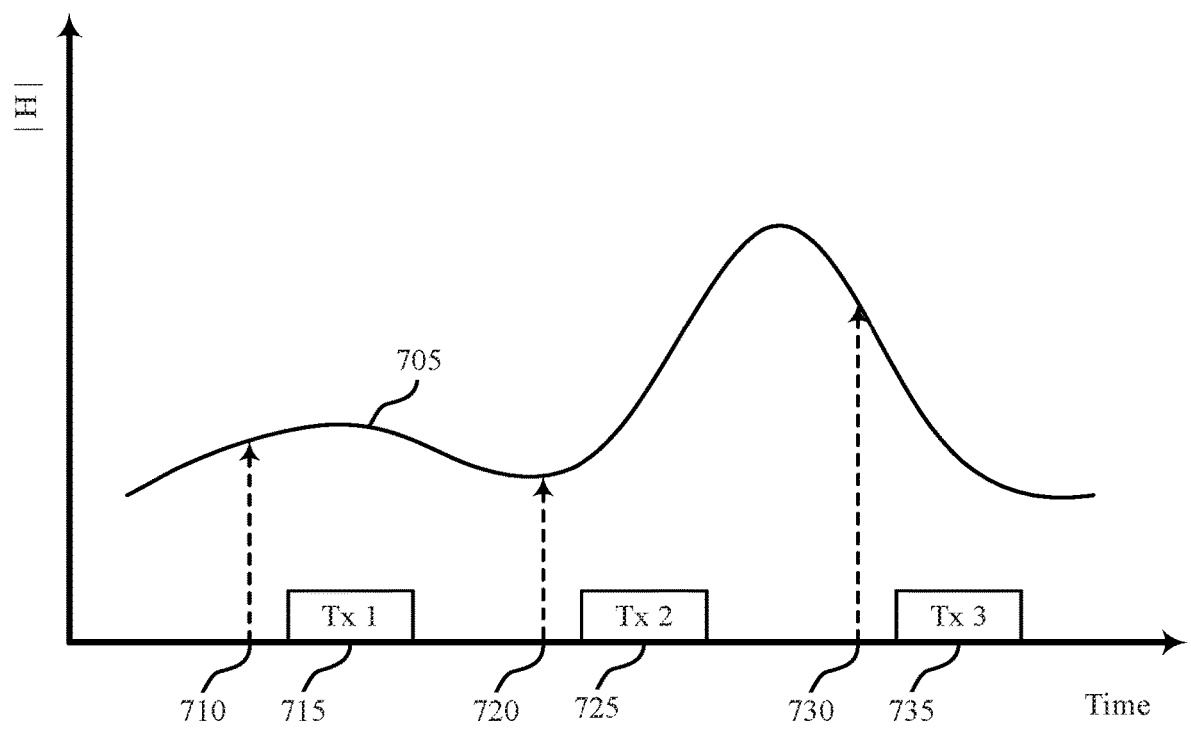
FIG. 7 illustrates an example of a timing diagram that supports polar codes over time-varying channels in accordance with aspects of the present disclosure.

FIG. 7 illustrates an example of a timing diagram 700 that supports polar codes over time-varying channels in accordance with aspects of the present disclosure. In some examples, timing diagram 700 may implement aspects of wireless communications system 100.

The vertical axis of timing diagram 700 represents a channel transfer function |H|, which may be or represent an estimate of time-varying channel conditions for a given wireless channel. These time-varying channel conditions may be represented by channel curve 705. In accordance with the described techniques, a transmitting device and/or receiving device may attempt to estimate (e.g., periodically or aperiodically) channel curve 705 and may use the estimates to inform various communication operations. Though described in the context of a transmitting device, it is to be understood that aspects of the present example may additionally or alternatively be performed by a receiving device. For example, a channel estimate described as being obtained by the transmitting device may in some cases be based on a measurement performed by the receiving device, which measurement is then communicated to the transmitting device.

A device may obtain a first channel estimate 710 of channel curve 705. Example channel estimates include an SNR, a CQI, or the like. The device may transmit a first transmission 715 (e.g., Tx 1) to a receiving device. In some cases, first transmission 715 may be prepared according to a first polar code as described herein, and first transmission 715 may be prepared using first channel estimate 710. For example, first channel estimate 710 may be used to determine a coding rate and modulation scheme for first transmission 715. First channel estimate 710 may also be used to determine bit-channel reliabilities for the first polar code (e.g., using DE or FRANK bit-channel reliability estimation techniques). The receiving device may not successfully decode first transmission 715. In some cases, the receiving device may indicate the failed decoding operation to the transmitting device (e.g., via a NACK). Additionally or alternatively, the transmitting device may infer the failed decoding operation based on a lack of subsequent communication received from the receiving device (e.g., lack of receiving an ACK is interpreted as a NACK).

The transmitting device (e.g., and/or the receiving device) may obtain a second channel estimate 720 of channel curve 705. In some cases, channel estimates 710 or 720 may be obtained according to some periodic schedule (e.g., channel measurements performed every n ms). In some cases, second channel estimate 720 may be determined based on first transmission 715 (e.g., based on a reference signal included with first transmission 715). As another example, the receiving device may obtain second channel estimate 720 based on failing to decode the first transmission (e.g., and may communicate the second estimate to the transmitting device). That is, the receiving device may be triggered to analyze one or more channel reference signals based on failing to decode first transmission 715, and may report the updated channel conditions prior to second transmission 725 (e.g., within a message including a NACK for the first transmission).

The transmitting device may transmit a second transmission 725 (e.g., a retransmission, Tx 2). In accordance with aspects of the present disclosure, second transmission 725 may be based at least in part on second channel estimate 720. For example, a number of copied information bits (e.g., or some other parameter associated with the information bit mapping used to generate the second transmission) may be based on the comparison. In some cases (e.g., because of the symmetric property of channel polarization), the parameters of the polar-coded HARQ scheme illustrated by timing diagram 700 may be based on differences between the channel estimates obtained at 710 and 720 (e.g., rather than the absolute estimates themselves). Thus, in some cases a receiving device may communicate a difference between the channel estimate obtained at 710 and the channel estimate obtained at 720 (e.g., rather than transmitting the estimates themselves). In some cases, the channel estimates obtained at 710 and 720 may be coded bit metrics. That is, a measured channel estimate may be transformed to an average channel metric per coded bit. The coded bit metrics may be determined by removing the effects of, for example, the modulator orders for the transmissions. For example, even when an overall channel metric improves, if a higher modulation order is used, the coded bit metric (e.g., SNR or CQI per coded bit) may be lower. In some cases, the number of copied bits information bits for a second transmission 725 may be determined based on a lookup table as described with reference to FIG. 5. Alternatively, the encoder and/or decoder may perform DE or FRANK bit-channel reliability estimation, assigning channel conditions (e.g., per coded bit SNR or CQI) associated with the first transmission to bits of the first codeword and channel conditions (e.g., per coded bit SNR or CQI) associated with second transmission to bits of the second codeword. Additionally or alternatively, the bit-channel indices for copied bits may be determined from the number of the repeated bits based on reliability (e.g., matching lowest to highest or highest to highest, etc.), or based on other constraints such as self-decodability. It is to be understood that the timing of 710, 715, 720, and 725 illustrated in FIG. 7 is an example, and not to scale. That is, the transmitting device may obtain first channel estimate 710 at any point prior to first transmission 715, and may obtain second channel estimate 720 at any point between first transmission 715 and second transmission 725 including from first transmission 715.

In cases in which the receiving device fails to decode second transmission 725, analogous techniques may be used to determine a third channel estimate 730 and prepare a third transmission 735 (e.g., Tx 3, where third transmission 735 is based at least in part on third channel estimate 730). A number of copied bits for the third transmission may be determined, for example, based on a difference between coded bit metrics for the third transmission and the first transmission and between coded bit metrics for the third transmission and the second transmission.

Figure 8:
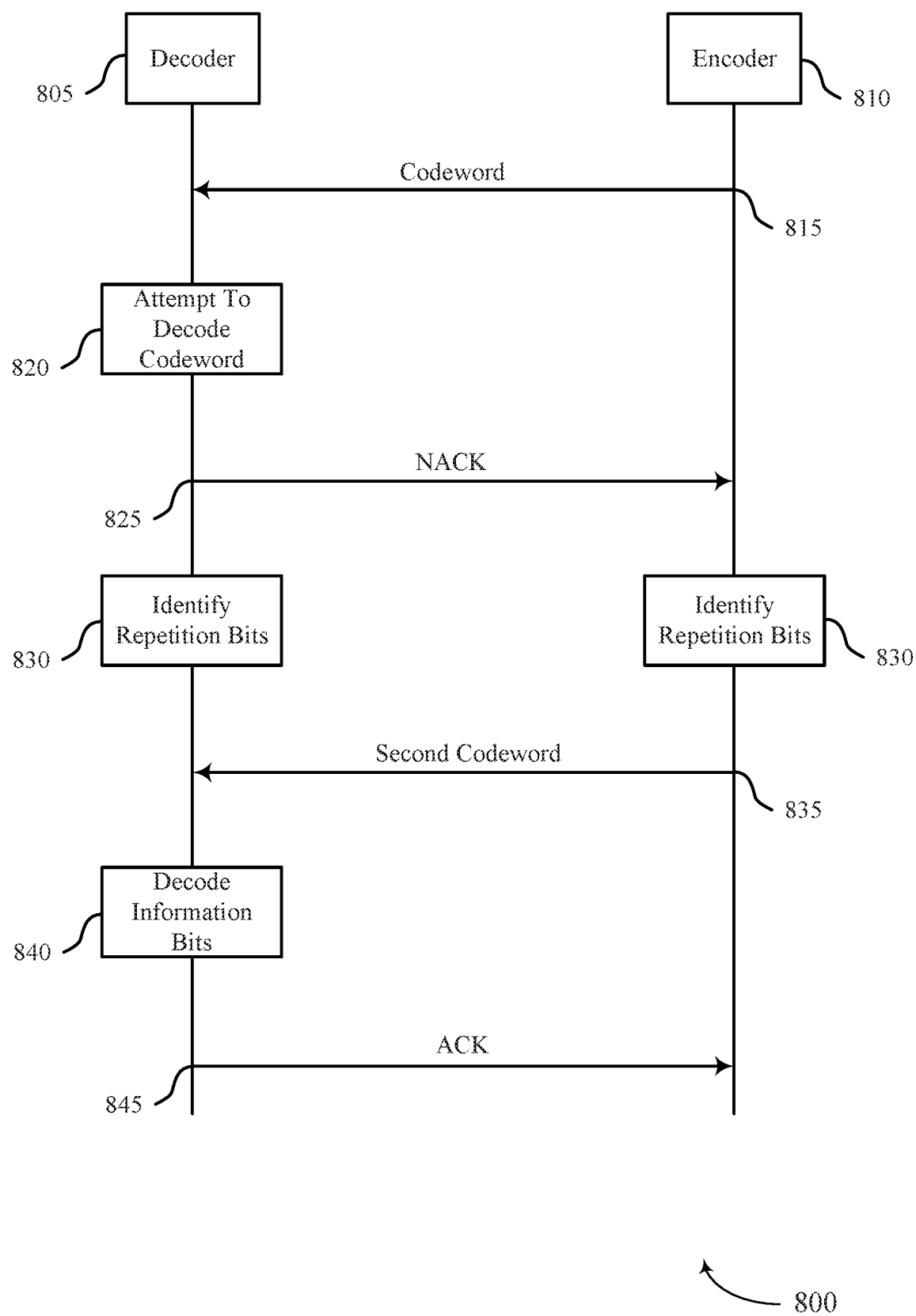
FIG. 8 illustrates an example of a process flow that supports polar codes over time-varying channels in accordance with aspects of the present disclosure.

FIG. 8 illustrates an example of a process flow 800 that supports polar codes over time-varying channels in accordance with aspects of the present disclosure. In some examples, process flow 800 may be implemented by aspects of wireless communications system 100. Process flow 800 includes a decoder 805 and an encoder 810 (e.g., each of which may be an example of a device 200 as described with reference to FIG. 2, a UE 115, or a base station 105 described with reference to FIG. 1, or the like).

At 815, encoder 810 may transmit a first codeword to decoder 805 over a wireless channel. For example, the first codeword may comprise a first set of encoded bits generated by mapping an information bit vector to a first set of polarized bit channels of a first polar code according to a first bit index set (e.g., where the first bit index set is based on respective bit channel reliabilities of the first set of polarized bit channels as described with reference to FIGS. 2-4). The respective bit channel reliabilities of the first set of polarized bit channels may be determined based on a first set of coded bit metrics that is based on a first channel measurement (e.g., made prior to 815).

At 820, decoder 805 may attempt to decode the first codeword (e.g., as described with reference to FIG. 2). Decoder 805 may indicate to encoder 810 that the decoding was unsuccessful at 825. In some examples, decoder 805 may not send any acknowledgement or NACK to encoder 810. In that case, encoder 810 may infer the decoding was unsuccessful. For example, decoder 805 may transmit a signal (e.g., a NACK) or may simply wait for a retransmission.

At 830, decoder 805 and/or encoder 810 may determine a number of repetition bits (e.g., or some other such parameter of the polar HARQ process) based at least in part on a channel metric of the wireless channel measured after 815 (e.g., after the initial transmission). For example, the number of repetition bits may be inversely related to a variance of the wireless channel (e.g., such that fewer bits may be repeated for channels exhibiting larger variance in channel conditions). In some examples, decoder 805 may measure the channel conditions and report the channel metric to encoder 810. For example, based on receiving a NACK, a base station may trigger an aperiodic channel state information (CSI) report. Alternatively, a CSI report may be automatically triggered when decoding is unsuccessful, and updated channel conditions reported after the initial transmission (e.g., as part of the NACK or as a different transmission). The channel condition information reported may be, for example, a coded bit metric (e.g., SNR or CQI per coded bit), or coded bit metric delta between a prior measurement (used for the first transmission), and the updated coded bit metric. Alternatively, for example where channel reciprocity exists, encoder 810 may measure the channel conditions directly. Encoder 810 may measure the channel conditions from the NACK received from decoder 805, or based on additional signals transmitted by decoder 805. For example, a base station may trigger a sounding reference signal transmission by a UE upon receiving a NACK, and may measure the channel conditions based on the sounding reference signal to determine the updated channel conditions.

At 835, encoder 810 may transmit the second codeword to decoder 805 over the wireless channel. For example, the second codeword may comprise a second set of encoded bits generated by mapping a repetition of at least one bit of the information bit vector (e.g., the repetition bits determined at 830) to a corresponding bit channel of a second set of polarized bit channels of a second polar code according to a second bit index set (e.g., where the first bit index set is based on respective bit channel reliabilities of the first set of polarized bit channels as described with reference to FIGS. 2-4). In some cases, the number of copied bits may be indicated as part of the second codeword (e.g., in control information associated with the second codeword). Thus, in some cases, decoder 805 may not identify the number of copied bits until receiving the second codeword at 835. The corresponding bit channels (e.g., the bit channels associated with the repetition bits) may be determined based at least in part on the number of copied bits (e.g., using one or more techniques described above such as bit-channel reliability comparison, progressive matching, self-decodability constraints, etc.).

At 840, decoder 805 may obtain the information bit vector by decoding the first and second set of encoded bits. At 845, decoder 805 may send a message (e.g., ACK) indicating that the information bit vector has been successfully decoded. Though described in the context of two codewords, it is to be understood that process flow 800 may be extended to include any suitable number of retransmissions in accordance with the present disclosure.

Figure 9:
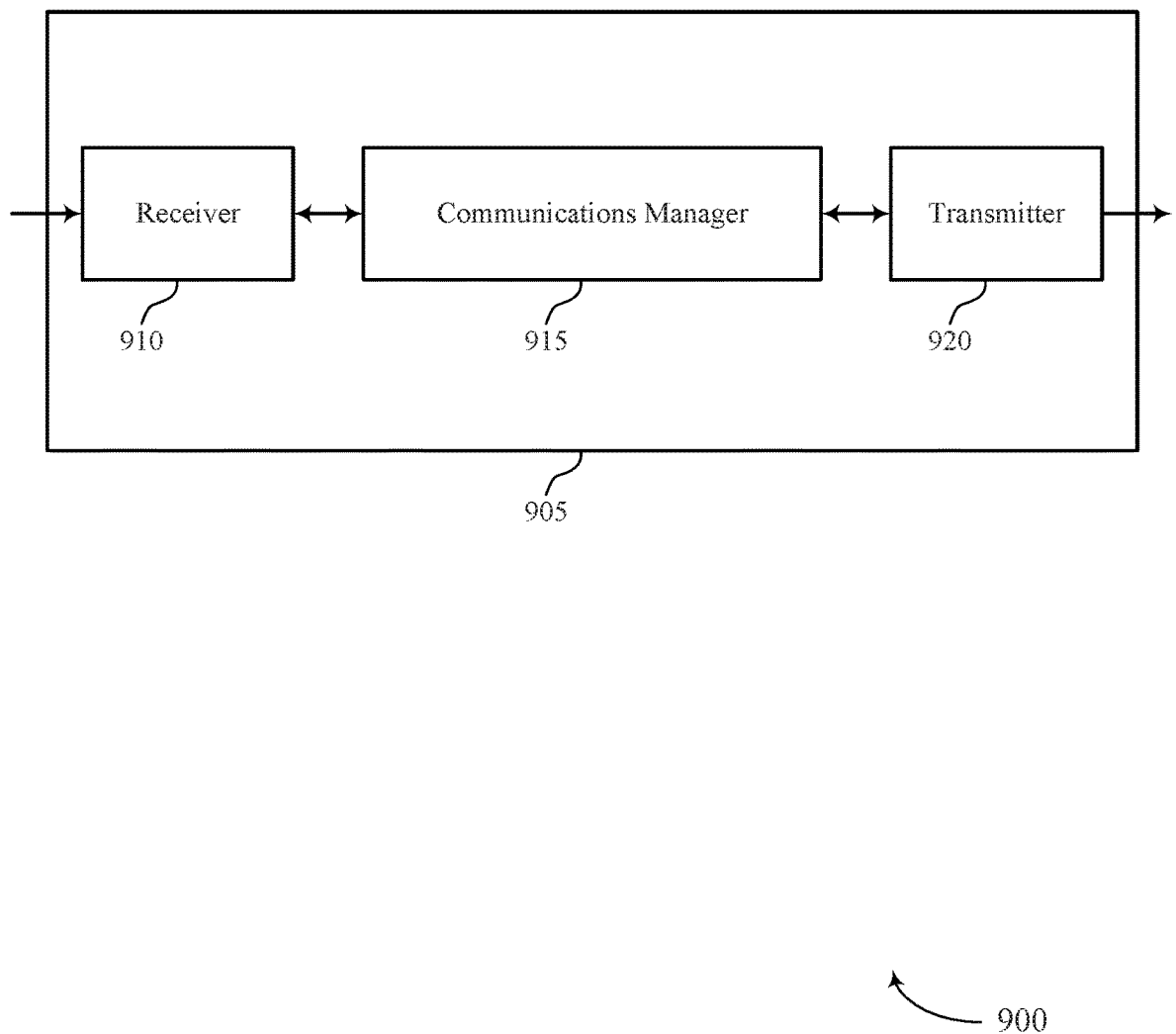
FIGS. 9 and 10 show block diagrams of devices that support polar codes over time-varying channels in accordance with aspects of the present disclosure.

FIG. 9 shows a block diagram 900 of a device 905 that supports polar codes over time-varying channels in accordance with aspects of the present disclosure. Device 905 may be an example of aspects of a device 200 as described with reference to FIG. 2 or a decoder 805 as described with reference to FIG. 8. Device 905 may include a receiver 910, a communications manager 915, and a transmitter 920. Device 905 may also include a processor. Each of these components may be in communication with one another (e.g., via one or more buses).

Receiver 910 may receive information such as packets, user data, or control information associated with various information channels (e.g., control channels, data channels, and information related to polar codes over time-varying channels, etc.). Information may be passed on to other components of device 905. Receiver 910 may be an example of aspects of a transceiver 1220 described with reference to FIG. 12. Receiver 910 may utilize a single antenna or a set of antennas.

Communications manager 915 may receive a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels. Communications manager 915 may cause an indication that a decoding of the first set of encoded bits was unsuccessful to be transmitted to the device. Communications manager 915 may receive a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. Communications manager 915 may obtain the information bit vector by decoding the first and second sets of encoded bits. Communications manager 915 may be an example of aspects of a communications manager 1210 described herein.

Communications manager 915, or its sub-components, may be implemented in hardware, code (e.g., software or firmware) executed by a processor, or any combination thereof. If implemented in code executed by a processor, the functions of the communications manager 915, or its sub-components may be executed by a general-purpose processor, a DSP, an application-specific integrated circuit (ASIC), a field-programmable gate array (FPGA) or other programmable logic device, discrete gate or transistor logic, discrete hardware components, or any combination thereof designed to perform the functions described in the present disclosure.

Communications manager 915, or its sub-components, may be physically located at various positions, including being distributed such that portions of functions are implemented at different physical locations by one or more physical components. In some examples, communications manager 915, or its sub-components, may be a separate and distinct component in accordance with various aspects of the present disclosure. In some examples, communications manager 915, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

Transmitter 920 may transmit signals generated by other components of device 905. In some examples, transmitter 920 may be collocated with receiver 910 in a transceiver module. For example, transmitter 920 may be an example of aspects of transceiver 1220 described with reference to FIG. 12. Transmitter 920 may utilize a single antenna or a set of antennas.

Figure 10:
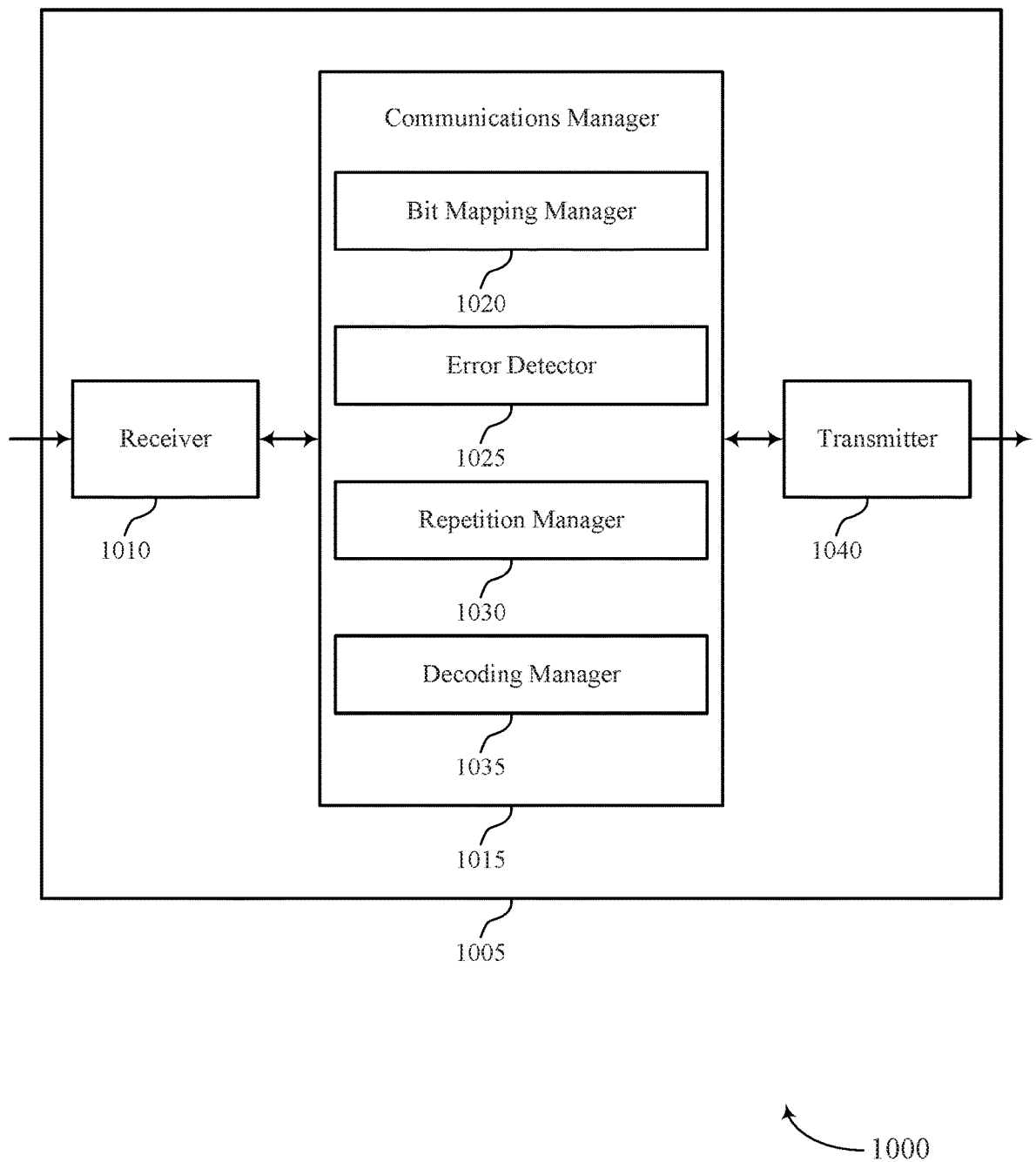

FIG. 10 shows a block diagram 1000 of a device 1005 that supports polar codes over time-varying channels in accordance with aspects of the present disclosure. Device 1005 may be an example of aspects of a device 905 as described with reference to FIG. 9, a device 200 as described with reference to FIG. 2 or a decoder 805 as described with reference to FIG. 8. Device 1005 may include a receiver 1010, a communications manager 1015, and a transmitter 1040. Device 1005 may also include a processor. Each of these components may be in communication with one another (e.g., via one or more buses).

Receiver 1010 may receive information such as packets, user data, or control information associated with various information channels (e.g., control channels, data channels, and information related to polar codes over time-varying channels, etc.). Information may be passed on to other components of device 1005. Receiver 1010 may be an example of aspects of transceiver 1220 described with reference to FIG. 12. Receiver 1010 may utilize a single antenna or a set of antennas.

Communications manager 1015 may be an example of aspects of a communications manager 915 as described herein. Communications manager 1015 may include a bit mapping manager 1020, an error detector 1025, a repetition manager 1030, and a decoding manager 1035. Communications manager 1015 may be an example of aspects of communications manager 1210 described herein.

Bit mapping manager 1020 may receive a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels.

Error detector 1025 may cause transmitter 1040 to transmit, to the device, an indication that a decoding of the first set of encoded bits was unsuccessful. In some examples, error detector 1025 determines decoding of the first set of encoded bits was unsuccessful but does not cause transmitter 1040 to transmit, to the device, any ACK or NACK.

Repetition manager 1030 may receive a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. Repetition manager 1030 may in some cases share hardware or otherwise overlap with (e.g., control) bit mapping manager 1020.

Decoding manager 1035 may obtain the information bit vector by decoding the first and second sets of encoded bits.

Transmitter 1040 may transmit signals generated by other components of the device 1005. In some examples, transmitter 1040 may be collocated with receiver 1010 in a transceiver module. For example, transmitter 1040 may be an example of aspects of transceiver 1220 described with reference to FIG. 12. Transmitter 1040 may utilize a single antenna or a set of antennas.

Figure 11:
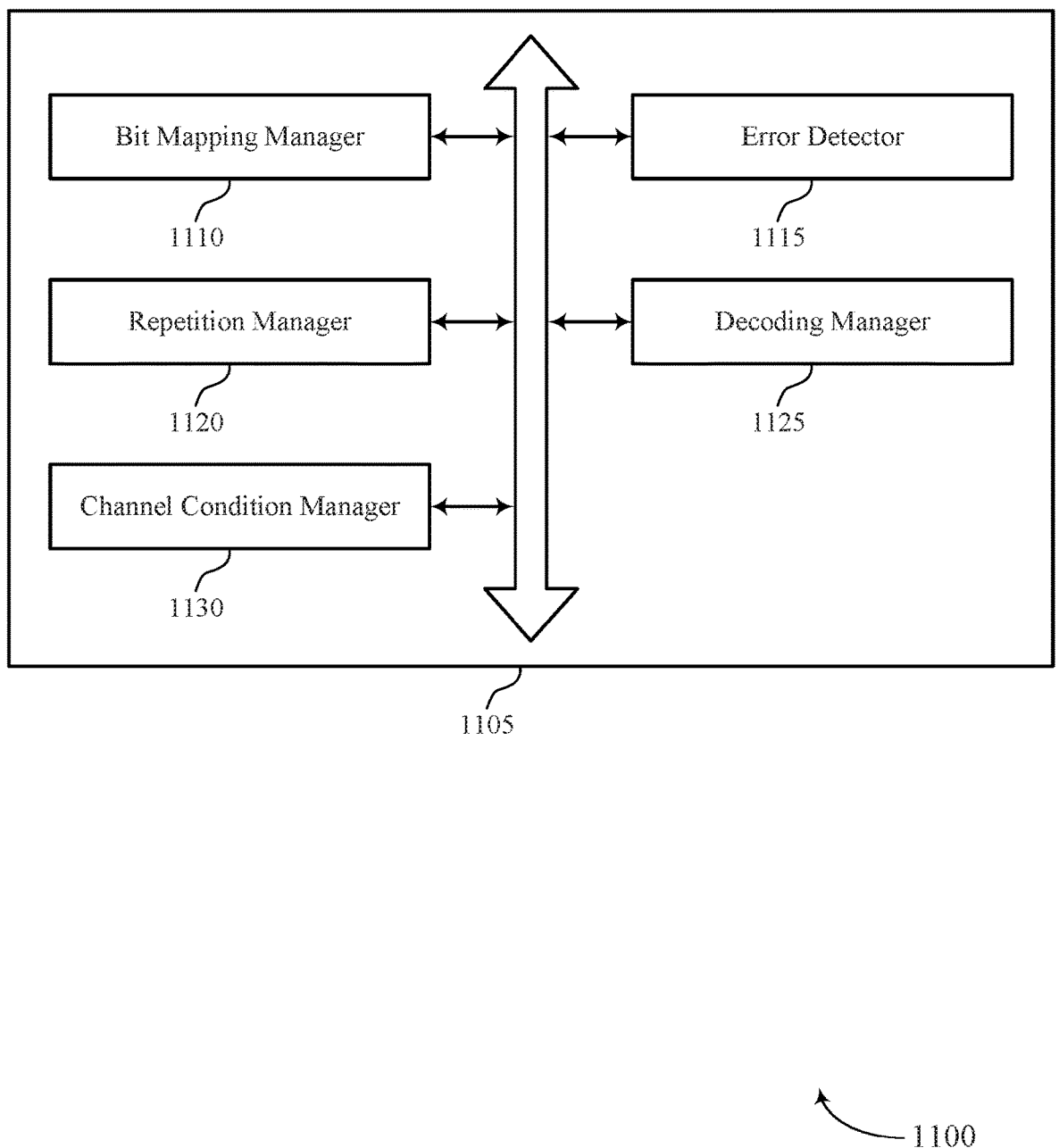
FIG. 11 shows a block diagram of a communications manager that supports polar codes over time-varying channels in accordance with aspects of the present disclosure.

FIG. 11 shows a block diagram 1100 of a communications manager 1105 that supports polar codes over time-varying channels in accordance with aspects of the present disclosure. Communications manager 1105 may be an example of aspects of a communications manager 915, a communications manager 1015, or a communications manager 1210 described herein. Communications manager 1105 may include a bit mapping manager 1110, an error detector 1115, a repetition manager 1120, a decoding manager 1125, and a channel condition manager 1130. Each of these modules may communicate, directly or indirectly, with one another (e.g., via one or more buses).

Bit mapping manager 1110 may receive a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels. In some cases, the first set of encoded bits includes a subset of encoded bits of a codeword generated by the first polar code.

Error detector 1115 may transmit, to the device, an indication that a decoding of the first set of encoded bits was unsuccessful.

Repetition manager 1120 may receive a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. In some examples, repetition manager 1120 may determine a number of bits in the at least one bit of the information bit vector. In some examples, repetition manager 1120 may perform a density evolution operation on the second polar code based on the channel metric. In some examples, repetition manager 1120 may identify the number of bits in a look-up table based on the channel metric. In some examples, repetition manager 1120 may determine a magnitude of a difference between the channel metric and an initial channel metric measured prior to the receiving the first set of encoded bits. In some examples, repetition manager 1120 may receive, in a control transmission scheduling the second set of encoded bits, an indication of the channel metric or a number of bits in the at least one bit of the information bit vector. In some cases, the second set of encoded bits includes a second subset of encoded bits of a second codeword generated by the second polar code. In some cases, the second set of encoded bits has a same bit length as the first set of encoded bits. In some cases, the second set of encoded bits has a different bit length from the first set of encoded bits.

Decoding manager 1125 may obtain the information bit vector by decoding the first and second sets of encoded bits.

Channel condition manager 1130 may determine a respective coded bit metric for each bit of the second set of encoded bits based on the channel metric and a modulation order for the second set of encoded bits, where the number of bits is based on the respective coded bit metrics. In some examples, channel condition manager 1130 may transmit channel feedback to the device over the wireless channel after the receiving the first set of encoded bits, the channel feedback including the channel metric, an initial channel metric measured prior to the receiving the first set of encoded bits, a magnitude of a difference between the channel metric and the initial channel metric, or a combination thereof. In some examples, channel condition manager 1130 may measure the channel metric subsequent to the receiving the first set of encoded bits. In some examples, channel condition manager 1130 may receive, from the device, a trigger to provide channel feedback, where the trigger is received after the indication that decoding the first set of encoded bits was unsuccessful and prior to the receiving the second set of encoded bits. In some cases, the channel metric includes an SNR, a CQI, an RSRP, an RSRQ, or a combination thereof.

Figure 12:
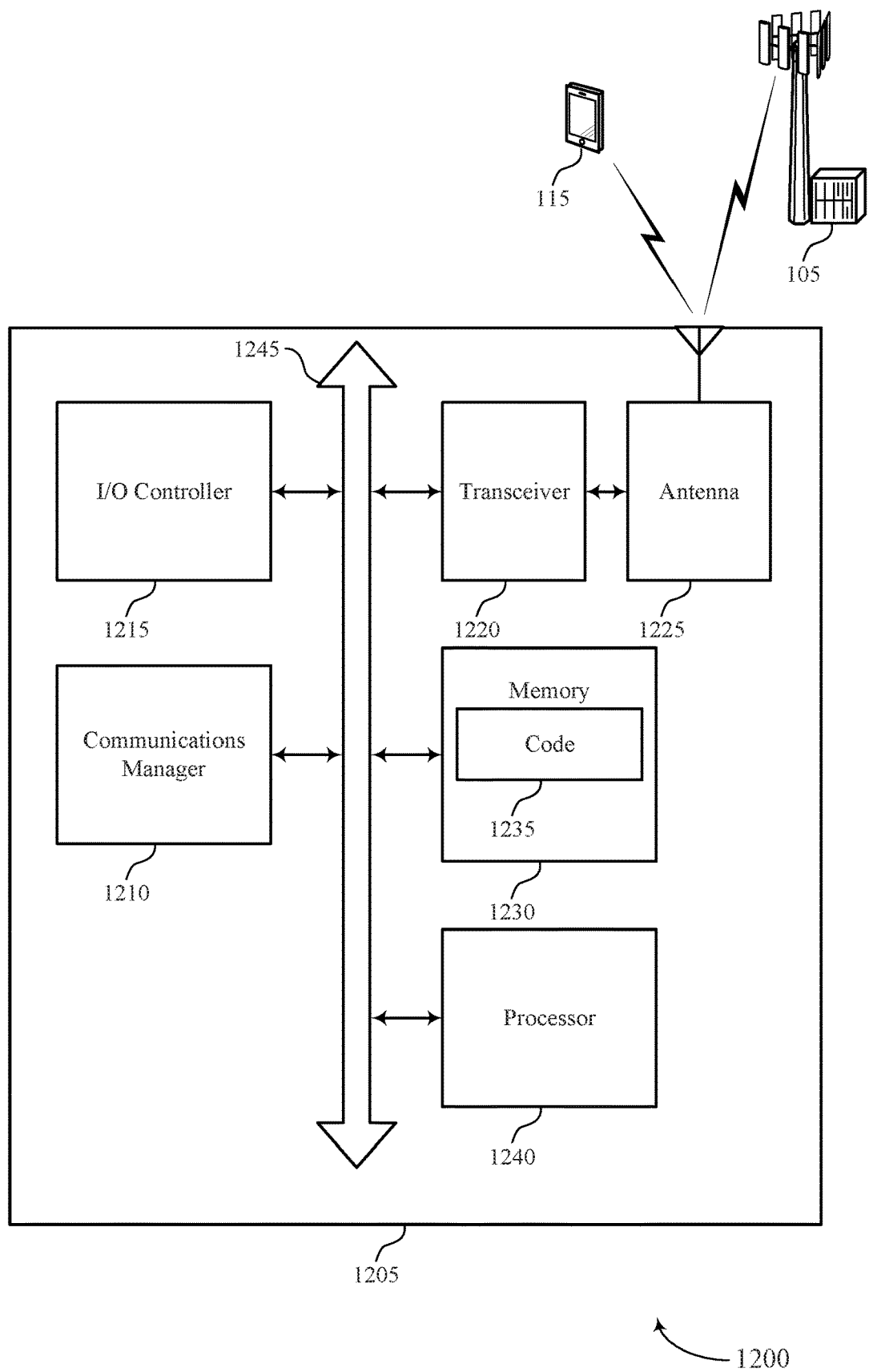
FIG. 12 shows a diagram of a system including a device that supports polar codes over time-varying channels in accordance with aspects of the present disclosure.

FIG. 12 shows a diagram of a system 1200 including a device 1205 that supports polar codes over time-varying channels in accordance with aspects of the present disclosure. Device 1205 may be an example of or include the components of device 905, device 1005, or a device 200 as described herein. Device 1205 may include components for bi-directional voice and data communications including components for transmitting and receiving communications, including a communications manager 1210, an I/O controller 1215, a transceiver 1220, an antenna 1225, memory 1230, and a processor 1240. These components may be in electronic communication via one or more buses (e.g., bus 1245).

Communications manager 1210 may receive a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels, transmit, to the device, an indication that a decoding of the first set of encoded bits was unsuccessful, receive a second set of encoded bits from the device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits, and obtain the information bit vector by decoding the first and second sets of encoded bits.

I/O controller 1215 may manage input and output signals for the device 1205. I/O controller 1215 may also manage peripherals not integrated into the device 1205. In some cases, I/O controller 1215 may represent a physical connection or port to an external peripheral. In some cases, I/O controller 1215 may utilize an operating system such as iOS®, ANDROID®, MS-DOS®, MS-WINDOWS®, OS/2®, UNIX®, LINUX®, or another known operating system. In other cases, I/O controller 1215 may represent or interact with a modem, a keyboard, a mouse, a touchscreen, or a similar device. In some cases, I/O controller 1215 may be implemented as part of a processor, such as processor 1240. In some cases, a user may interact with device 1205 via I/O controller 1215 or via hardware components controlled by I/O controller 1215.

Transceiver 1220 may communicate bi-directionally, via one or more antennas, wired, or wireless links as described above. For example, transceiver 1220 may represent a wireless transceiver and may communicate bi-directionally with another wireless transceiver. Transceiver 1220 may also include a modem to modulate the packets and provide the modulated packets to the antennas for transmission, and to demodulate packets received from the antennas.

In some cases, the device 1205 may include a single antenna 1225. However, in some cases device 1205 may have more than one antenna 1225, which may be capable of concurrently transmitting or receiving multiple wireless transmissions.

Memory 1230 may include RAM and ROM. Memory 1230 may store computer-readable, computer-executable code 1235 including instructions that, when executed, cause the processor to perform various functions described herein. In some cases, memory 1230 may contain, among other things, a BIOS which may control basic hardware or software operation such as the interaction with peripheral components or devices.

Processor 1240 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1240 may be configured to operate a memory array using a memory controller. In other cases, a memory controller may be integrated into processor 1240. Processor 1240 may be configured to execute computer-readable instructions stored in a memory (e.g., memory 1230) to cause device 1205 to perform various functions (e.g., functions or tasks supporting polar codes over time-varying channels).

Code 1235 may include instructions to implement aspects of the present disclosure, including instructions to support wireless communication. Code 1235 may be stored in a non-transitory computer-readable medium such as system memory or other type of memory. In some cases, code 1235 may not be directly executable by processor 1240 but may cause a computer (e.g., when compiled and executed) to perform functions described herein.

Figure 13:
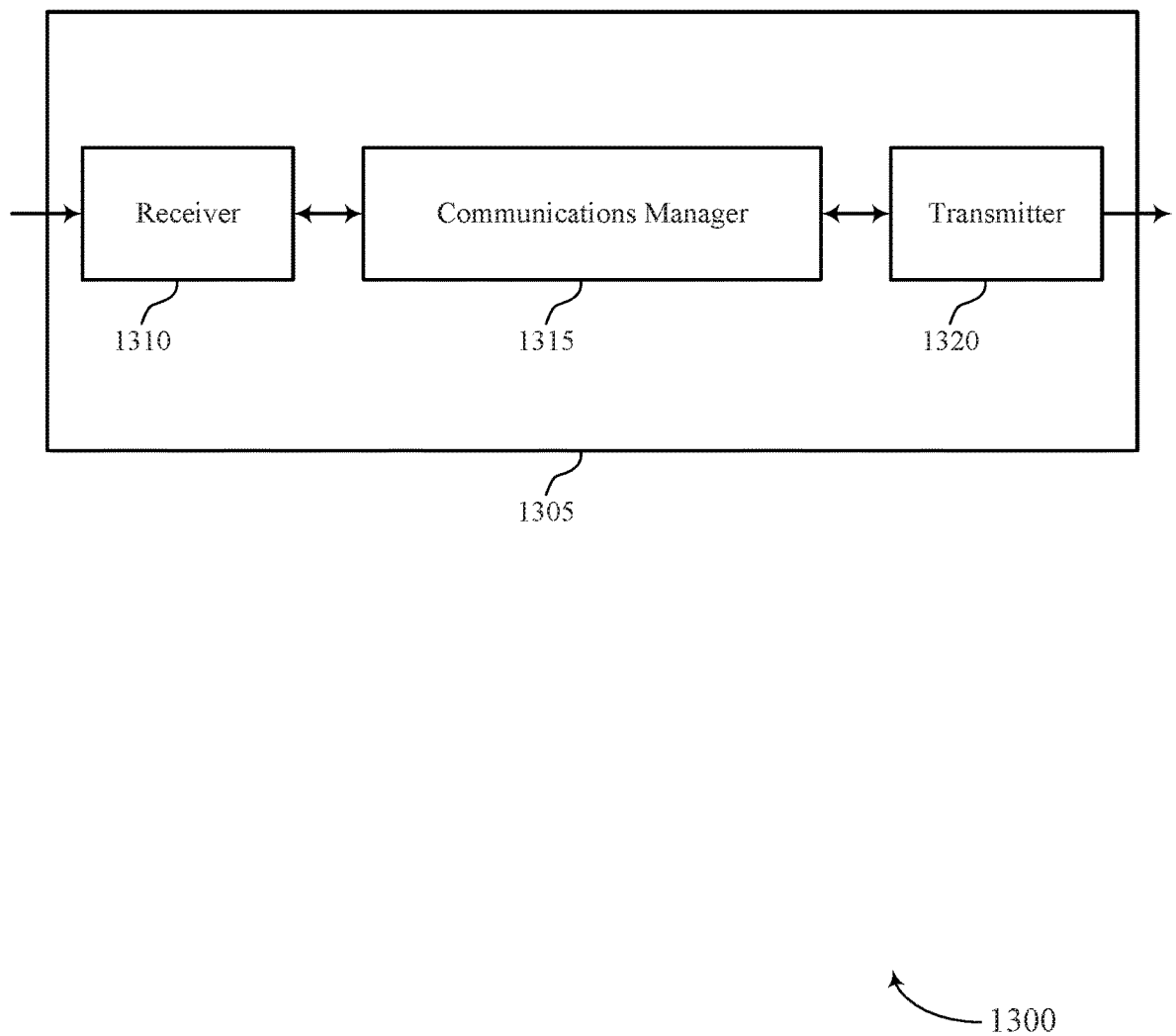
FIGS. 13 and 14 show block diagrams of devices that support polar codes over time-varying channels in accordance with aspects of the present disclosure.

FIG. 13 shows a block diagram 1300 of a device 1305 that supports polar codes over time-varying channels in accordance with aspects of the present disclosure. Device 1305 may be an example of aspects of a device 200 as described with reference to FIG. 2 or an encoder 810 as described with reference to FIG. 8. Although described separately for the sake of explanation, it is to be understood that in some cases a single wireless device (e.g., device 200) may be able to perform aspects of the encoding and decoding techniques described herein. Thus, in some cases, device 1305 may be an example of a device 905. Device 1305 may include a receiver 1310, a communications manager 1315, and a transmitter 1320. Device 1305 may also include a processor. Each of these components may be in communication with one another (e.g., via one or more buses).

Receiver 1310 may receive information such as packets, user data, or control information associated with various information channels (e.g., control channels, data channels, and information related to polar codes over time-varying channels, etc.). Information may be passed on to other components of device 1305. Receiver 1310 may be an example of aspects of a transceiver 1620 described with reference to FIG. 16. Receiver 1310 may utilize a single antenna or a set of antennas.

Communications manager 1315 may generate a first set of encoded bits by mapping an information bit vector to a first set of polarized bit channels of a first polar code according to a first bit index set, the first bit index set being based on respective bit channel reliabilities of the first set of polarized bit channels. Communications manager 1315 may cause transmitter 1320 to transmit the first set of encoded bits to a device over a wireless channel. Communications manager 1315 may receive via receiver 1310, from the device, an indication that a decoding of the first set of encoded bits was unsuccessful. Communications manager 1315 may generate a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. Communications manager 1315 may cause transmitter 1320 to transmit the second set of encoded bits to the device over the wireless channel. Communications manager 1315 may be an example of aspects of a communications manager 1610 described herein.

Communications manager 1315, or its sub-components, may be implemented in hardware, code (e.g., software or firmware) executed by a processor, or any combination thereof. If implemented in code executed by a processor, the functions of communications manager 1315, or its sub-components may be executed by a general-purpose processor, a DSP, an ASIC, a FPGA or other programmable logic device, discrete gate or transistor logic, discrete hardware components, or any combination thereof designed to perform the functions described in the present disclosure.

Communications manager 1315, or its sub-components, may be physically located at various positions, including being distributed such that portions of functions are implemented at different physical locations by one or more physical components. In some examples, communications manager 1315, or its sub-components, may be a separate and distinct component in accordance with various aspects of the present disclosure. In some examples, communications manager 1315, or its sub-components, may be combined with one or more other hardware components, including but not limited to an I/O component, a transceiver, a network server, another computing device, one or more other components described in the present disclosure, or a combination thereof in accordance with various aspects of the present disclosure.

Transmitter 1320 may transmit signals generated by other components of device 1305. In some examples, transmitter 1320 may be collocated with receiver 1310 in a transceiver module. For example, transmitter 1320 may be an example of aspects of a transceiver 1620 described with reference to FIG. 16. Transmitter 1320 may utilize a single antenna or a set of antennas.

Figure 14:
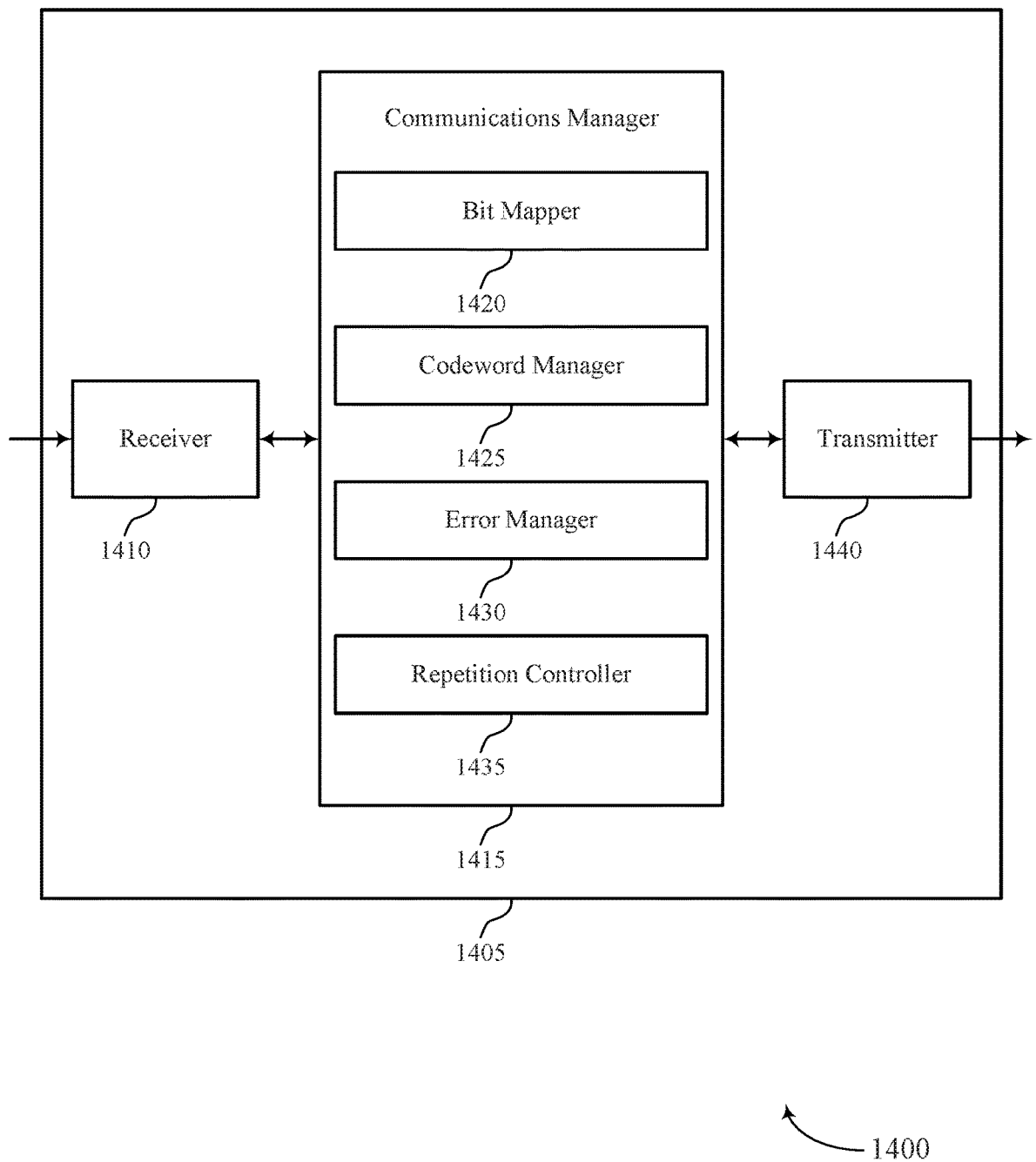

FIG. 14 shows a block diagram 1400 of a device 1405 that supports polar codes over time-varying channels in accordance with aspects of the present disclosure. Device 1405 may be an example of aspects of a device 1305, a device 200, a device 1005, an encoder 810, etc. as described herein. Device 1405 may include a receiver 1410, a communications manager 1415, and a transmitter 1440. Device 1405 may also include a processor. Each of these components may be in communication with one another (e.g., via one or more buses).

Receiver 1410 may receive information such as packets, user data, or control information associated with various information channels (e.g., control channels, data channels, and information related to polar codes over time-varying channels, etc.). Information may be passed on to other components of device 1405. Receiver 1410 may be an example of aspects of transceiver 1620 described with reference to FIG. 16. Receiver 1410 may utilize a single antenna or a set of antennas.

Communications manager 1415 may be an example of aspects of communications manager 1315 as described herein. Communications manager 1415 may include a bit mapper 1420, a codeword manager 1425, an error manager 1430, and a repetition controller 1435. Communications manager 1415 may be an example of aspects of communications manager 1610 described herein.

Bit mapper 1420 may generate a first set of encoded bits by mapping an information bit vector to a first set of polarized bit channels of a first polar code according to a first bit index set, the first bit index set being based on respective bit channel reliabilities of the first set of polarized bit channels.

Codeword manager 1425 may transmit the first set of encoded bits to a device over a wireless channel, and cause transmitter 1440 to transmit the second set of encoded bits to the device over the wireless channel.

Error manager 1430 may receive, from the device, an indication that a decoding of the first set of encoded bits was unsuccessful.

Repetition controller 1435 may generate a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits.

Transmitter 1440 may transmit signals generated by other components of device 1405. In some examples, transmitter 1440 may be collocated with receiver 1410 in a transceiver module. For example, transmitter 1440 may be an example of aspects of transceiver 1620 described with reference to FIG. 16. Transmitter 1440 may utilize a single antenna or a set of antennas.

Figure 15:
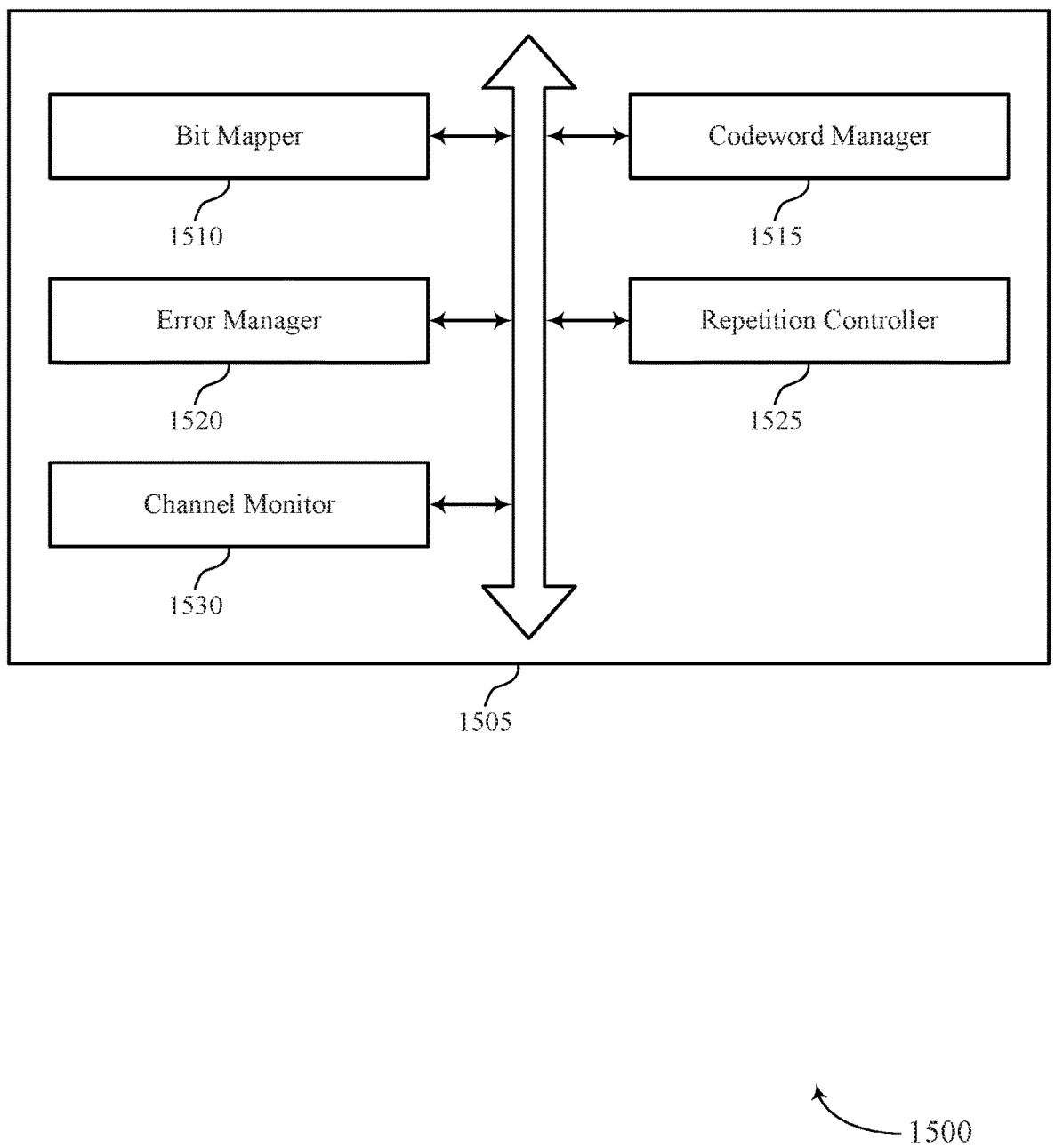
FIG. 15 shows a block diagram of a communications manager that supports polar codes over time-varying channels in accordance with aspects of the present disclosure.

FIG. 15 shows a block diagram 1500 of a communications manager 1505 that supports polar codes over time-varying channels in accordance with aspects of the present disclosure. Communications manager 1505 may be an example of aspects of a communications manager 1315, a communications manager 1415, or a communications manager 1610 described herein. Communications manager 1505 may include a bit mapper 1510, a codeword manager 1515, an error manager 1520, a repetition controller 1525, and a channel monitor 1530. Each of these modules may communicate, directly or indirectly, with one another (e.g., via one or more buses).

Bit mapper 1510 may generate a first set of encoded bits by mapping an information bit vector to a first set of polarized bit channels of a first polar code according to a first bit index set, the first bit index set being based on respective bit channel reliabilities of the first set of polarized bit channels. In some cases, the first set of encoded bits includes a subset of encoded bits of a codeword generated by the first polar code.

Codeword manager 1515 may transmit, or cause to be transmitted, the first set of encoded bits to a device over a wireless channel. In some examples, codeword manager 1515 may transmit, or cause to be transmitted, the second set of encoded bits to the device over the wireless channel.

Error manager 1520 may receive via a receiver, from the device, an indication that a decoding of the first set of encoded bits was unsuccessful.

Repetition controller 1525 may generate a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits.

In some examples, repetition controller 1525 may determine a number of bits in the at least one bit of the information bit vector. In some examples, repetition controller 1525 may perform a density evolution operation on the second polar code based on the channel metric. In some examples, repetition controller 1525 may identify the number of bits in a look-up table based on the channel metric. In some examples, repetition controller 1525 may determine a magnitude of a difference between the channel metric and an initial channel metric measured prior to the receiving the first set of encoded bits. In some examples, repetition controller 1525 may transmit, or cause to be transmitted, in a control transmission scheduling the second set of encoded bits, an indication of the channel metric or a number of bits in the at least one bit of the information bit vector. In some cases, the second set of encoded bits includes a second subset of encoded bits of a second codeword generated by the second polar code. In some cases, the second set of encoded bits has a same bit length as the first set of encoded bits. In some cases, the second set of encoded bits has a different bit length from the first set of encoded bits.

Channel monitor 1530 may determine a respective coded bit metric for each bit of the second set of encoded bits based on the channel metric and a modulation order for the second set of encoded bits, where the number of bits is based on the respective coded bit metrics. In some examples, channel monitor 1530 may receive channel feedback from the device over the wireless channel after the transmitting the first set of encoded bits, the channel feedback including the channel metric, an initial channel metric measured prior to the transmitting the first set of encoded bits, a magnitude of a difference between the channel metric and the initial channel metric, or a combination thereof. In some examples, channel monitor 1530 may measure the channel metric subsequent to the transmitting the first set of encoded bits. In some examples, channel monitor 1530 may transmit, to the device, a trigger to provide channel feedback, where the trigger is transmitted after the indication that the first set of encoded bits was unsuccessful and prior to the transmitting the second set of encoded bits. In some cases, the channel metric includes an SNR, a CQI, an RSRP, an RSRQ, or a combination thereof.

Figure 16:
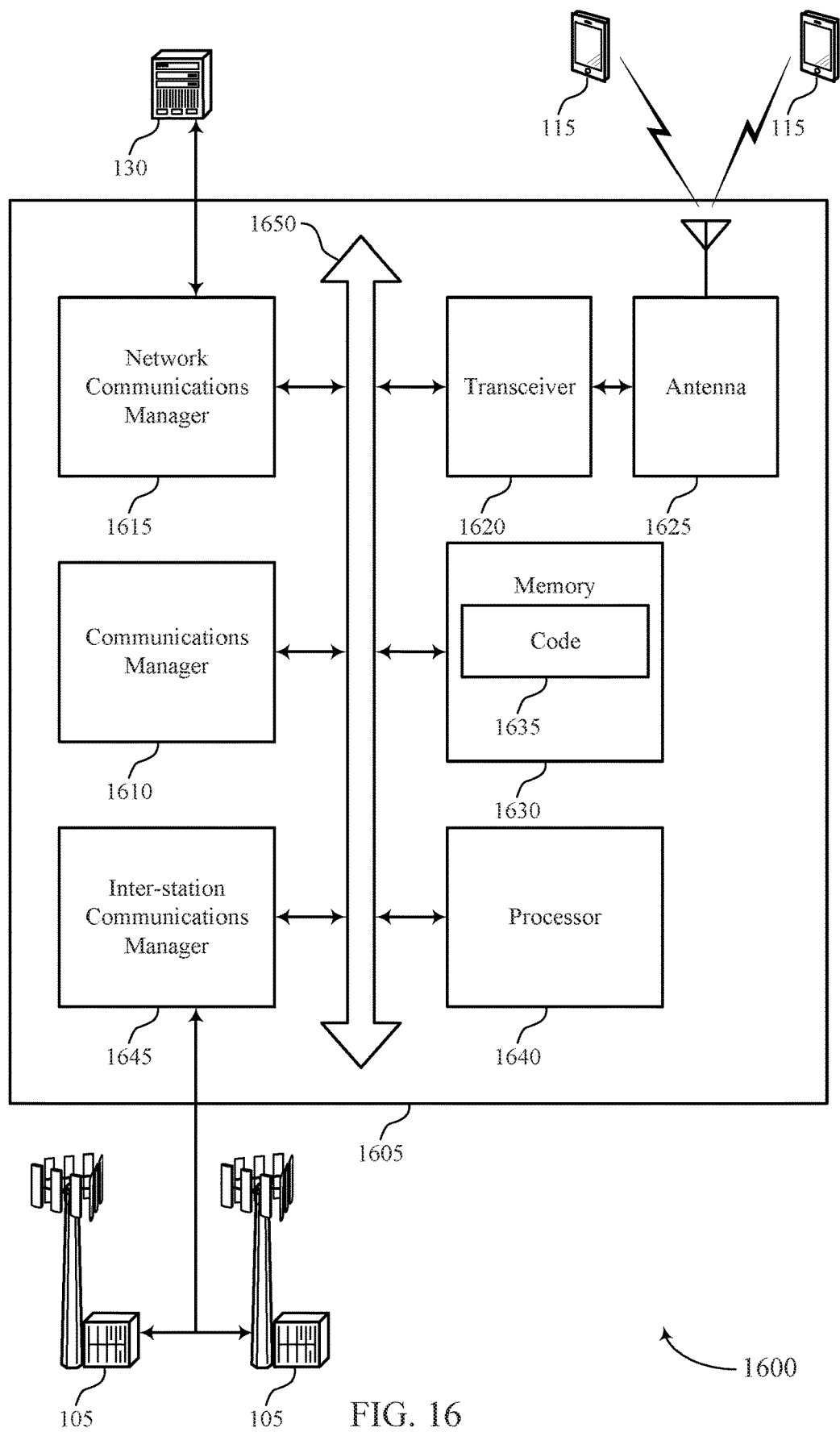
FIG. 16 shows a diagram of a system including a device that supports polar codes over time-varying channels in accordance with aspects of the present disclosure.

FIG. 16 shows a diagram of a system 1600 including a device 1605 that supports polar codes over time-varying channels in accordance with aspects of the present disclosure. Device 1605 may be an example of or include the components of a device 1305, a device 1405, etc. as described herein. Device 1605 may include components for bi-directional voice and data communications including components for transmitting and receiving communications, including a communications manager 1610, a network communications manager 1615, a transceiver 1620, an antenna 1625, memory 1630, a processor 1640, and an inter-station communications manager 1645. These components may be in electronic communication via one or more buses (e.g., bus 1650).

Communications manager 1610 may generate a first set of encoded bits by mapping an information bit vector to a first set of polarized bit channels of a first polar code according to a first bit index set, the first bit index set being based on respective bit channel reliabilities of the first set of polarized bit channels, transmit the first set of encoded bits to a device over a wireless channel. Communications manager 1610 may also transmit the second set of encoded bits to the device over the wireless channel, receive, from the device, an indication that a decoding of the first set of encoded bits was unsuccessful, and generate a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits.

Network communications manager 1615 may manage communications with the core network (e.g., via one or more wired backhaul links). For example, network communications manager 1615 may manage the transfer of data communications for client devices, such as one or more UEs 115.

Transceiver 1620 may communicate bi-directionally, via one or more antennas, wired, or wireless links as described above. For example, transceiver 1620 may represent a wireless transceiver and may communicate bi-directionally with another wireless transceiver. Transceiver 1620 may also include a modem to modulate the packets and provide the modulated packets to the antennas for transmission, and to demodulate packets received from the antennas. In some cases, device 1605 may include a single antenna 1625. However, in some cases device 1605 may have more than one antenna 1625, which may be capable of concurrently transmitting or receiving multiple wireless transmissions.

Memory 1630 may include RAM, ROM, or a combination thereof. Memory 1630 may store computer-readable code 1635 including instructions that, when executed by a processor (e.g., processor 1640) cause device 1605 to perform various functions described herein. In some cases, memory 1630 may contain, among other things, a BIOS which may control basic hardware or software operation such as the interaction with peripheral components or devices.

Processor 1640 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1640 may be configured to operate a memory array using a memory controller. In some cases, a memory controller may be integrated into processor 1640. Processor 1640 may be configured to execute computer-readable instructions stored in a memory (e.g., memory 1630) to cause device 1605 to perform various functions (e.g., functions or tasks supporting polar codes over time-varying channels).

Inter-station communications manager 1645 may manage communications with other base stations 105, and may include a controller or scheduler for controlling communications with UEs 115 in cooperation with other base stations 105. For example, inter-station communications manager 1645 may coordinate scheduling for transmissions to UEs 115 for various interference mitigation techniques such as beamforming or joint transmission. In some examples, inter-station communications manager 1645 may provide an X2 interface within an LTE/LTE-A wireless communication network technology to provide communication between base stations 105.

Code 1635 may include instructions to implement aspects of the present disclosure, including instructions to support wireless communication. Code 1635 may be stored in a non-transitory computer-readable medium such as system memory or other type of memory. In some cases, code 1635 may not be directly executable by processor 1640 but may cause a computer (e.g., when compiled and executed) to perform functions described herein.

Figure 17:
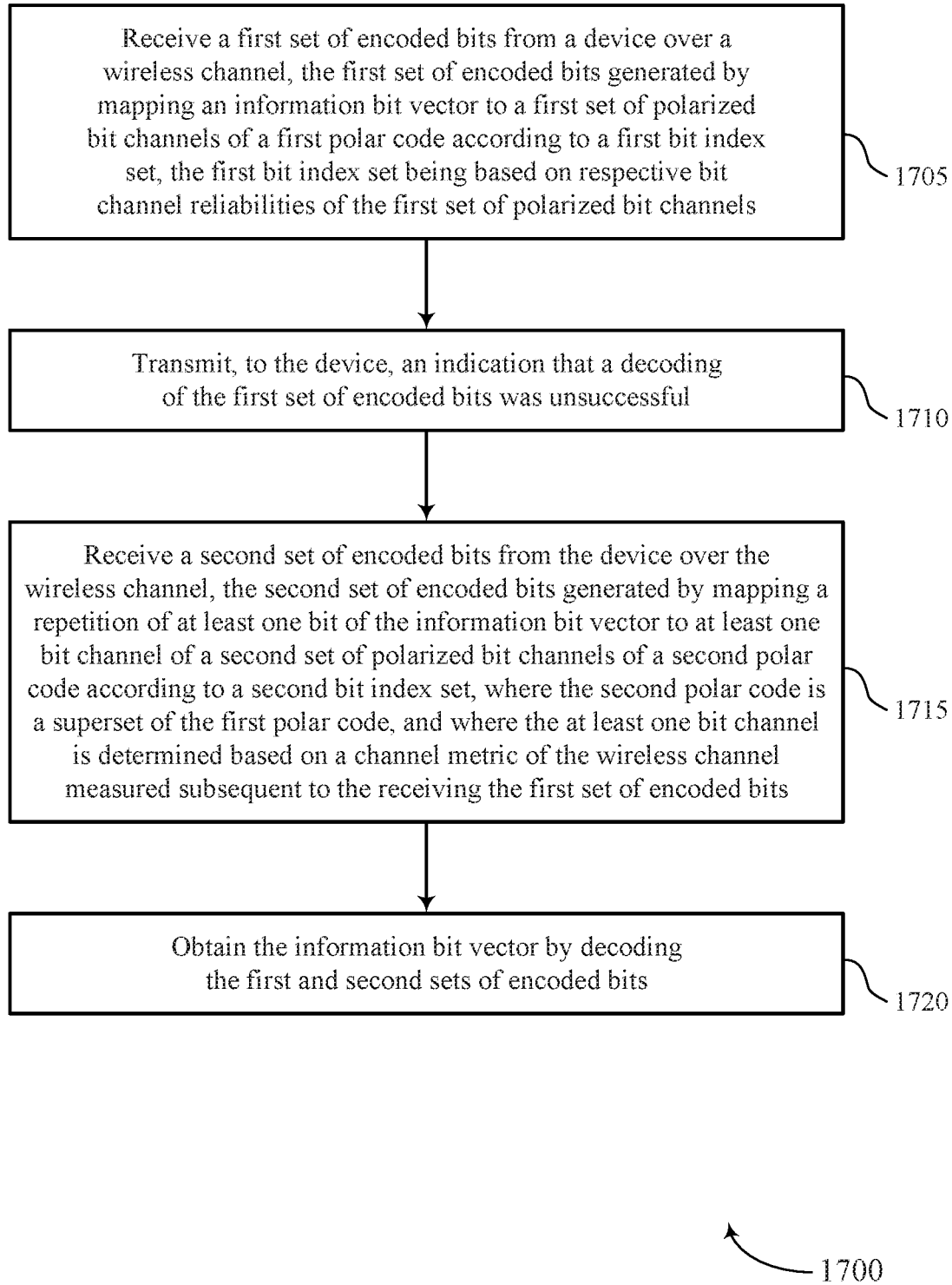
FIGS. 17 through 20 show flowcharts illustrating methods that support polar codes over time-varying channels in accordance with aspects of the present disclosure.

FIG. 17 shows a flowchart illustrating a method 1700 that supports polar codes over time-varying channels in accordance with aspects of the present disclosure. The operations of method 1700 may be implemented by a device or its components as described herein. For example, the operations of method 1700 may be performed by a communications manager as described with reference to FIGS. 9-12. In some examples, a device may execute a set of instructions to control the functional elements of the device to perform the functions described below. Additionally or alternatively, a device may perform aspects of the functions described below using special-purpose hardware.

At 1705, the device may receive a first set of encoded bits from another device over a wireless channel, the first set of encoded bits generated by mapping an information bit vector to a first set of polarized bit channels of a first polar code according to a first bit index set, the first bit index set being based on respective bit channel reliabilities of the first set of polarized bit channels. The operations of 1705 may be performed according to the methods described herein. In some examples, aspects of the operations of 1705 may be performed by a bit mapping manager as described with reference to FIGS. 9-12.

At 1710, the device may transmit, to the other device, an indication that a decoding of the first set of encoded bits was unsuccessful. The operations of 1710 may be performed according to the methods described herein. In some examples, aspects of the operations of 1710 may be performed by an error detector as described with reference to FIGS. 9-12.

At 1715, the device may receive a second set of encoded bits from the other device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. The operations of 1715 may be performed according to the methods described herein. In some examples, aspects of the operations of 1715 may be performed by a repetition manager as described with reference to FIGS. 9-12.

At 1720, the device may obtain the information bit vector by decoding the first and second sets of encoded bits. The operations of 1720 may be performed according to the methods described herein. In some examples, aspects of the operations of 1720 may be performed by a decoding manager as described with reference to FIGS. 9-12.

Figure 18:
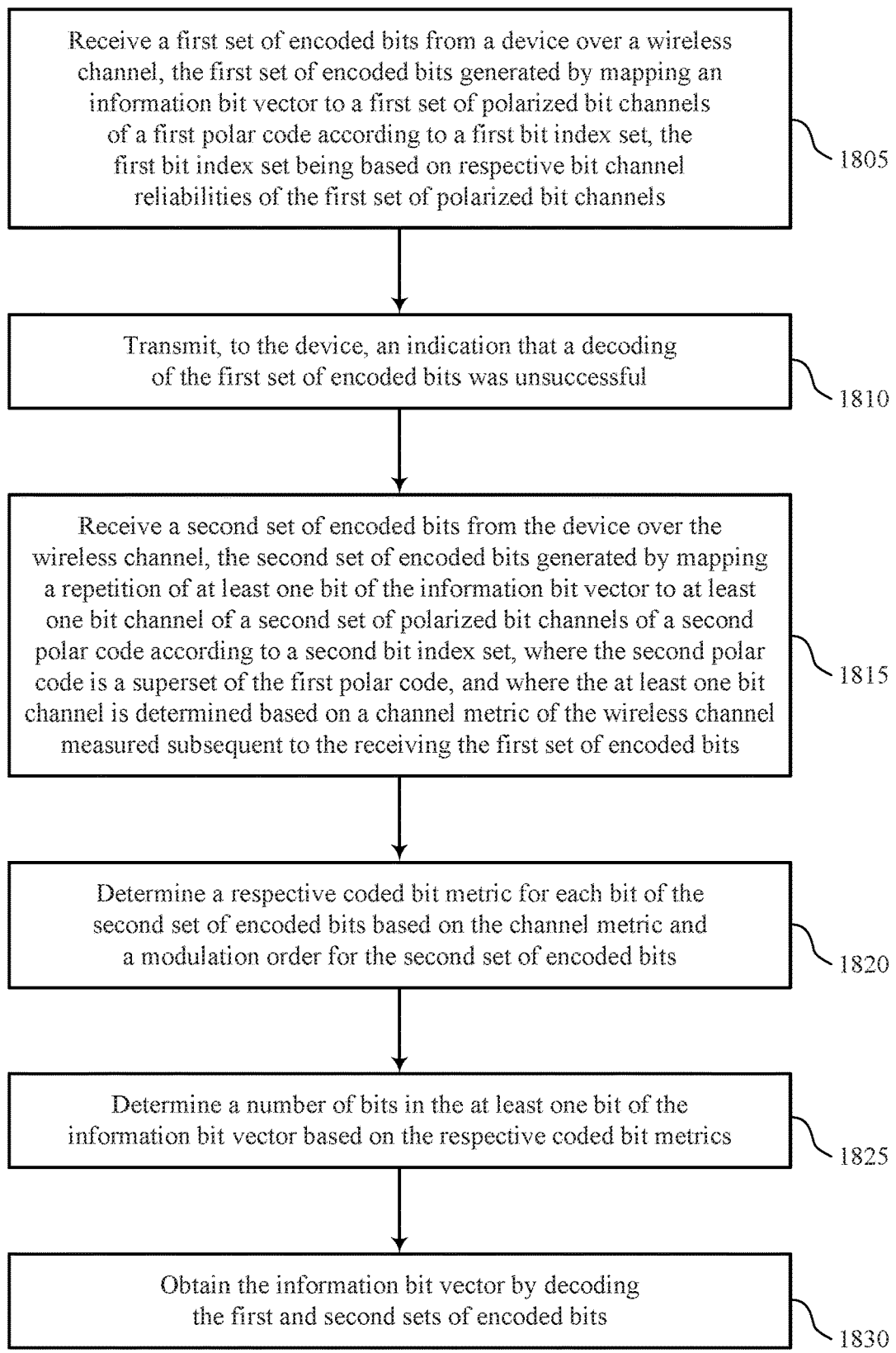

FIG. 18 shows a flowchart illustrating a method 1800 that supports polar codes over time-varying channels in accordance with aspects of the present disclosure. The operations of method 1800 may be implemented by a device or its components as described herein. For example, the operations of method 1800 may be performed by a communications manager as described with reference to FIGS. 9-12. In some examples, a device may execute a set of instructions to control the functional elements of the device to perform the functions described below. Additionally or alternatively, a device may perform aspects of the functions described below using special-purpose hardware.

At 1805, the device may receive a first set of encoded bits from another device over a wireless channel, the first set of encoded bits generated by mapping an information bit vector to a first set of polarized bit channels of a first polar code according to a first bit index set, the first bit index set being based on respective bit channel reliabilities of the first set of polarized bit channels. The operations of 1805 may be performed according to the methods described herein.

In some examples, aspects of the operations of 1805 may be performed by a bit mapping manager as described with reference to FIGS. 9-12.

At 1810, the device may transmit, to the other device, an indication that a decoding of the first set of encoded bits was unsuccessful. The operations of 1810 may be performed according to the methods described herein. In some examples, aspects of the operations of 1810 may be performed by an error detector as described with reference to FIGS. 9-12.

At 1815, the device may receive a second set of encoded bits from the other device over the wireless channel, the second set of encoded bits generated by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. The operations of 1815 may be performed according to the methods described herein. In some examples, aspects of the operations of 1815 may be performed by a repetition manager as described with reference to FIGS. 9-12.

At 1820, the device may determine a respective coded bit metric for each bit of the second set of encoded bits based on the channel metric and a modulation order for the second set of encoded bits. The operations of 1820 may be performed according to the methods described herein. In some examples, aspects of the operations of 1820 may be performed by a channel condition manager as described with reference to FIGS. 9-12.

At 1825, the device may determine a number of bits in the at least one bit of the information bit vector based on the respective coded bit metrics. The operations of 1825 may be performed according to the methods described herein. In some examples, aspects of the operations of 1825 may be performed by a repetition manager as described with reference to FIGS. 9-12.

At 1830, the device may obtain the information bit vector by decoding the first and second sets of encoded bits. The operations of 1830 may be performed according to the methods described herein. In some examples, aspects of the operations of 1830 may be performed by a decoding manager as described with reference to FIGS. 9-12.

Figure 19:
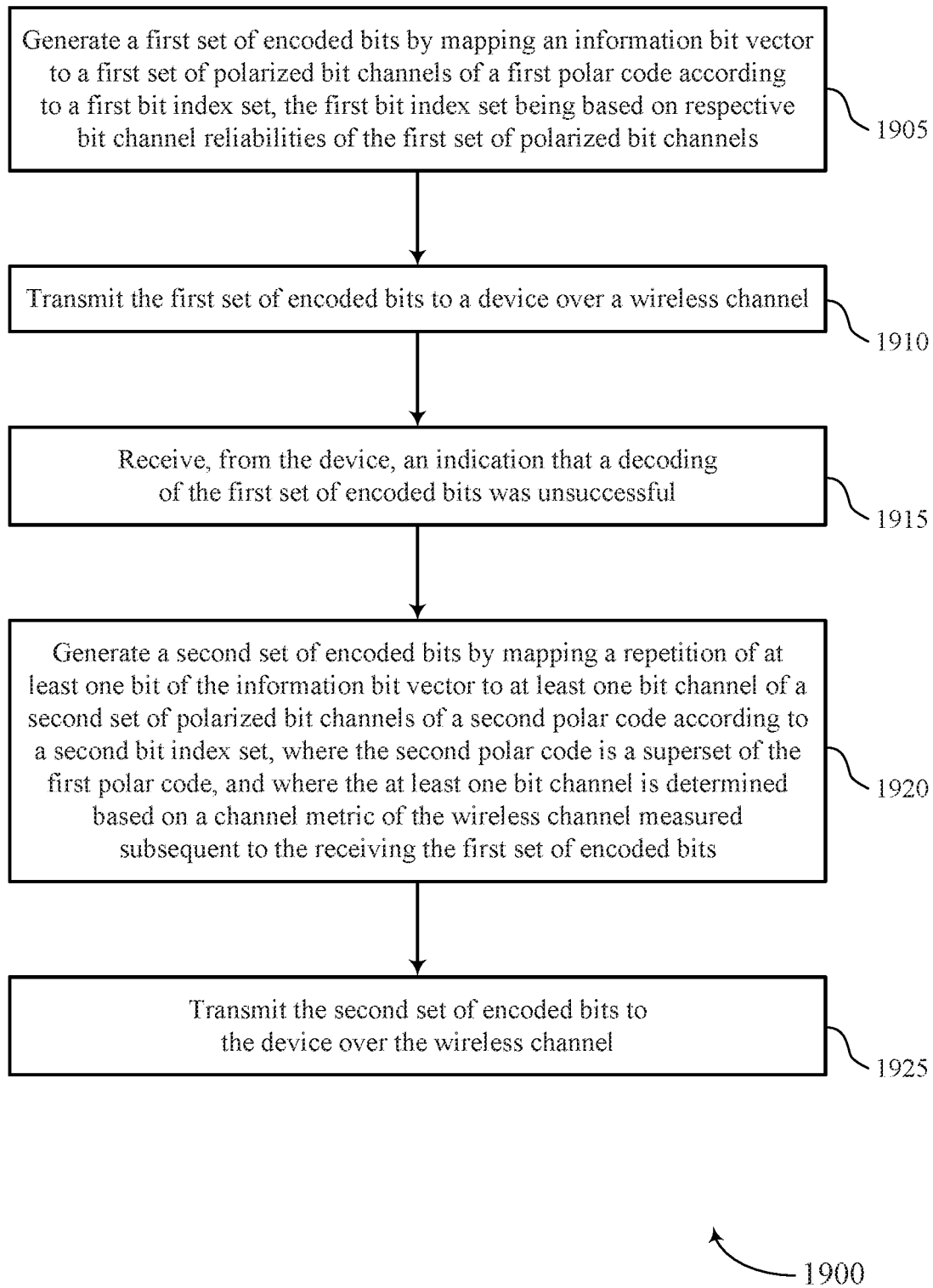

FIG. 19 shows a flowchart illustrating a method 1900 that supports polar codes over time-varying channels in accordance with aspects of the present disclosure. The operations of method 1900 may be implemented by a device or its components as described herein. For example, the operations of method 1900 may be performed by a communications manager as described with reference to FIGS. 13-16. In some examples, a device may execute a set of instructions to control the functional elements of the device to perform the functions described below. Additionally or alternatively, a device may perform aspects of the functions described below using special-purpose hardware.

At 1905, the device may generate a first set of encoded bits by mapping an information bit vector to a first set of polarized bit channels of a first polar code according to a first bit index set, the first bit index set being based on respective bit channel reliabilities of the first set of polarized bit channels. The operations of 1905 may be performed according to the methods described herein. In some examples, aspects of the operations of 1905 may be performed by a bit mapper as described with reference to FIGS. 13-16.

At 1910, the device may transmit the first set of encoded bits to another device over a wireless channel. The operations of 1910 may be performed according to the methods described herein. In some examples, aspects of the operations of 1910 may be performed by a codeword manager as described with reference to FIGS. 13-16.

At 1915, the device may receive, from the other device, an indication that a decoding of the first set of encoded bits was unsuccessful. The operations of 1915 may be performed according to the methods described herein. In some examples, aspects of the operations of 1915 may be performed by an error manager as described with reference to FIGS. 13-16.

At 1920, the device may generate a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. The operations of 1920 may be performed according to the methods described herein. In some examples, aspects of the operations of 1920 may be performed by a repetition controller as described with reference to FIGS. 13-16.

At 1925, the device may transmit the second set of encoded bits to the other device over the wireless channel. The operations of 1925 may be performed according to the methods described herein. In some examples, aspects of the operations of 1925 may be performed by a codeword manager as described with reference to FIGS. 13-16.

Figure 20:
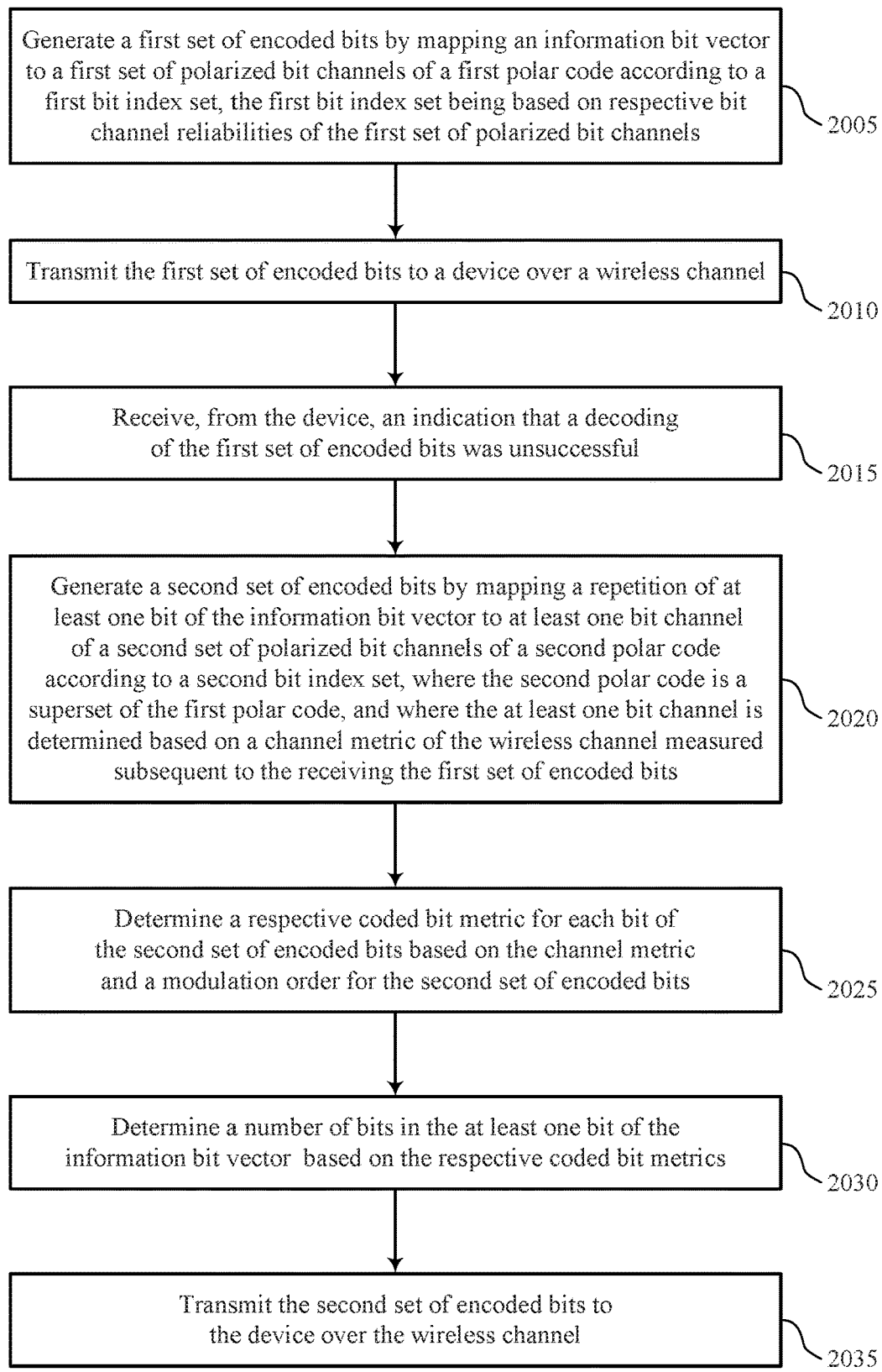

FIG. 20 shows a flowchart illustrating a method 2000 that supports polar codes over time-varying channels in accordance with aspects of the present disclosure. The operations of method 2000 may be implemented by a device or its components as described herein. For example, the operations of method 2000 may be performed by a communications manager as described with reference to FIGS. 13-16. In some examples, a device may execute a set of instructions to control the functional elements of the device to perform the functions described below. Additionally or alternatively, a device may perform aspects of the functions described below using special-purpose hardware.

At 2005, the device may generate a first set of encoded bits by mapping an information bit vector to a first set of polarized bit channels of a first polar code according to a first bit index set, the first bit index set being based on respective bit channel reliabilities of the first set of polarized bit channels. The operations of 2005 may be performed according to the methods described herein. In some examples, aspects of the operations of 2005 may be performed by a bit mapper as described with reference to FIGS. 13-16.

At 2010, the device may transmit the first set of encoded bits to another device over a wireless channel. The operations of 2010 may be performed according to the methods described herein. In some examples, aspects of the operations of 2010 may be performed by a codeword manager as described with reference to FIGS. 13-16.

At 2015, the device may receive, from the other device, an indication that a decoding of the first set of encoded bits was unsuccessful. The operations of 2015 may be performed according to the methods described herein. In some examples, aspects of the operations of 2015 may be performed by an error manager as described with reference to FIGS. 13-16.

At 2020, the device may generate a second set of encoded bits by mapping a repetition of at least one bit of the information bit vector to at least one bit channel of a second set of polarized bit channels of a second polar code according to a second bit index set, where the second polar code is a superset of the first polar code, and where the at least one bit channel is determined based on a channel metric of the wireless channel measured subsequent to the receiving the first set of encoded bits. The operations of 2020 may be performed according to the methods described herein. In some examples, aspects of the operations of 2020 may be performed by a repetition controller as described with reference to FIGS. 13-16.

At 2025, the device may determine a respective coded bit metric for each bit of the second set of encoded bits based on the channel metric and a modulation order for the second set of encoded bits. The operations of 2025 may be performed according to the methods described herein. In some examples, aspects of the operations of 2025 may be performed by a channel monitor as described with reference to FIGS. 13-16.

At 2030, the device may determine a number of bits in the at least one bit of the information bit vector based on the respective coded bit metrics. The operations of 2030 may be performed according to the methods described herein. In some examples, aspects of the operations of 2030 may be performed by a repetition controller as described with reference to FIGS. 13-16.

At 2035, the device may transmit the second set of encoded bits to the other device over the wireless channel. The operations of 2035 may be performed according to the methods described herein. In some examples, aspects of the operations of 2035 may be performed by a codeword manager as described with reference to FIGS. 13-16.

It should be noted that the methods described above describe possible implementations, and that the operations and the steps may be rearranged or otherwise modified and that other implementations are possible. Further, aspects from two or more of the methods may be combined.

Embodiment 1: A method for wireless communication, comprising: generating a first set of encoded bits by mapping an information bit vector to a first set of polarized bit channels of a first polar code according to a first bit index set, the first bit index set being based on respective bit channel reliabilities of the first set of polarized bit channels; transmitting the first set of encoded bits to a device over a wireless channel; receiving, from the device, an indication that a decoding of the first set of encoded bits was unsuccessful; generating a second set of encoded bits by mapping a repetition of at least one bit of the information bit vector to at least one bit channel of a second set of polarized bit channels of a second polar code according to a second bit index set, wherein the second polar code is a superset of the first polar code, and wherein the at least one bit channel is determined based at least in part on a channel metric of the wireless channel measured subsequent to the receiving the first set of encoded bits; and transmitting the second set of encoded bits to the device over the wireless channel.

Embodiment 2: The method of embodiment 1, further comprising: transmitting, in a control transmission scheduling the second set of encoded bits, an indication of the channel metric or a number of bits in the at least one bit of the information bit vector.

Embodiment 3: The method of any of embodiments 1 or 2, wherein the channel metric comprises a signal to noise ratio (SNR), a channel quality indicator (CQI), a reference signal received power (RSRP), a reference signal received quality (RSRQ), or a combination thereof.

Embodiment 4: The method of any of embodiments 1 to 3, further comprising: receiving channel feedback from the device over the wireless channel after the transmitting the first set of encoded bits, the channel feedback comprising the channel metric, an initial channel metric measured prior to the transmitting the first set of encoded bits, a magnitude of a difference between the channel metric and the initial channel metric, or a combination thereof.

Embodiment 5: The method of any of embodiments 1 to 4, further comprising: determining a number of bits in the at least one bit of the information bit vector.

Embodiment 6: The method of embodiment 5, wherein determining the number of bits in the at least one bit of the information bit vector comprises: performing a density evolution operation on the second polar code based at least in part on the channel metric.

Embodiment 7: The method of embodiment 5, wherein determining the number of bits in the at least one bit of the information bit vector comprises: identifying the number of bits in a look-up table based at least in part on the channel metric.

Embodiment 8: The method of embodiment 5, wherein determining the number of bits in the at least one bit of the information bit vector comprises: determining a magnitude of a difference between the channel metric and an initial channel metric measured prior to the receiving the first set of encoded bits.

Embodiment 9: The method of embodiment 5, further comprising: determining a respective coded bit metric for each bit of the second set of encoded bits based at least in part on the channel metric and a modulation order for the second set of encoded bits, wherein the number of bits is based at least in part on the respective coded bit metrics.

Embodiment 10: The method of any of embodiments 1 to 9, further comprising: measuring the channel metric subsequent to the transmitting the first set of encoded bits.

Embodiment 11: The method of any of embodiments 1 to 10, further comprising: transmitting, to the device, a trigger to provide channel feedback, wherein the trigger is transmitted after the indication that the first set of encoded bits was unsuccessful and prior to the transmitting the second set of encoded bits.

Embodiment 12: The method of any of embodiments 1 to 11, wherein the first set of encoded bits comprises a subset of encoded bits of a codeword generated by the first polar code.

Embodiment 13: The method of embodiment 12, wherein the second set of encoded bits comprises a second subset of encoded bits of a second codeword generated by the second polar code.

Embodiment 14: An apparatus comprising at least one means for performing a method of any of embodiments 1 to 13.

Embodiment 15: An apparatus for wireless communications comprising a processor; memory in electronic communication with the processor; and instructions stored in the memory and executable by the processor to cause the apparatus to perform a method of any of embodiments 1 to 13.

Embodiment 16: A non-transitory computer-readable medium storing code for wireless communications, the code comprising instructions executable by a processor to perform a method of any of embodiments 1 to 13.

Embodiment 17: A method for wireless communication, comprising: receiving a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit channels; transmitting, to the device, an indication that a decoding of the first set of encoded bits was unsuccessful; receiving a second set of encoded bits from the device over the wireless channel, the second set of encoded bits generated by mapping a repetition of at least one bit of the information bit vector to at least one bit channel of a second set of polarized bit channels of a second polar code according to a second bit index set, wherein the second polar code is a superset of the first polar code, and wherein the at least one bit channel is determined based at least in part on a channel metric of the wireless channel measured subsequent to the receiving the first set of encoded bits; and obtaining the information bit vector by decoding the first and second sets of encoded bits.

Embodiment 18: The method of embodiment 17, further comprising: receiving, in a control transmission scheduling the second set of encoded bits, an indication of the channel metric or a number of bits in the at least one bit of the information bit vector.

Embodiment 19: The method of any of embodiments 17 or 18, wherein the channel metric comprises a signal-to-noise ratio (SNR), a channel quality indicator (CQI), a reference signal received power (RSRP), a reference signal received quality (RSRQ), or a combination thereof.

Embodiment 20: The method of any of embodiments 17 to 19, further comprising: transmitting channel feedback to the device over the wireless channel after the receiving the first set of encoded bits, the channel feedback comprising the channel metric, an initial channel metric measured prior to the receiving the first set of encoded bits, a magnitude of a difference between the channel metric and the initial channel metric, or a combination thereof.

Embodiment 21: The method of any of embodiments 17 to 20, further comprising: measuring the channel metric subsequent to the receiving the first set of encoded bits.

Embodiment 22: The method of any of embodiments 17 to 21, further comprising: determining a number of bits in the at least one bit of the information bit vector.

Embodiment 23: The method of embodiment 22, wherein determining the number of bits in the at least one bit of the information bit vector comprises: performing a density evolution operation on the second polar code based at least in part on the channel metric.

Embodiment 24: The method of embodiment 22, wherein determining the number of bits in the at least one bit of the information bit vector comprises: identifying the number of bits in a look-up table based at least in part on the channel metric.

Embodiment 25: The method of embodiment 22, wherein determining the number of bits in the at least one bit of the information bit vector comprises: determining a magnitude of a difference between the channel metric and an initial channel metric measured prior to the receiving the first set of encoded bits.

Embodiment 26: The method of embodiment 22, further comprising: determining a respective coded bit metric for each bit of the second set of encoded bits based at least in part on the channel metric and a modulation order for the second set of encoded bits, wherein the number of bits is based at least in part on the respective coded bit metrics.

Embodiment 27: The method of any of embodiments 17 to 26, further comprising: receiving, from the device, a trigger to provide channel feedback, wherein the trigger is received after the indication that the first set of encoded bits was unsuccessful and prior to the receiving the second set of encoded bits.

Embodiment 28: The method of any of embodiments 17 to 27, wherein the first set of encoded bits comprises a subset of encoded bits of a codeword generated by the first polar code.

Embodiment 29: The method of embodiment 28, wherein the second set of encoded bits comprises a second subset of encoded bits of a second codeword generated by the second polar code.

Embodiment 30: An apparatus comprising at least one means for performing a method of any of embodiments 17 to 29.

Embodiment 31: An apparatus for wireless communications comprising a processor; memory in electronic communication with the processor; and instructions stored in the memory and executable by the processor to cause the apparatus to perform a method of any of embodiments 17 to 29.

Embodiment 32: A non-transitory computer-readable medium storing code for wireless communications, the code comprising instructions executable by a processor to perform a method of any of embodiments 17 to 29.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, a FPGA or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
generating a first set of encoded bits by mapping an information bit vector to a first set of polarized bit channels of a first polar code according to a first bit index set, the first bit index set being based on respective bit channel reliabilities of the first set of polarized bit channels;
transmitting the first set of encoded bits to a device over a wireless channel;
receiving, from the device, an indication that a decoding of the first set of encoded bits was unsuccessful;
generating a second set of encoded bits by mapping a repetition of at least one bit of the information bit vector to at least one bit channel of a second set of polarized bit channels of a second polar code according to a second bit index set, wherein the second polar code is a superset of the first polar code, and wherein the at least one bit channel is determined based at least in part on a channel metric of the wireless channel measured subsequent to the receiving the first set of encoded bits; and transmitting the second set of encoded bits to the device over the wireless channel.

2. The method of claim 1, further comprising:
transmitting, in a control transmission scheduling the second set of encoded bits, an indication of the channel metric or a number of bits in the at least one bit of the information bit vector.

3. The method of claim 1, wherein the channel metric comprises a signal to noise ratio (SNR), a channel quality indicator (CQI), a reference signal received power (RSRP), a reference signal received quality (RSRQ), or a combination thereof.

4. The method of claim 1, further comprising:
receiving channel feedback from the device over the wireless channel after the transmitting the first set of encoded bits, the channel feedback comprising the channel metric, an initial channel metric measured prior to the transmitting the first set of encoded bits, a magnitude of a difference between the channel metric and the initial channel metric, or a combination thereof.

5. The method of claim 1, further comprising:
determining a number of bits in the at least one bit of the information bit vector.

6. The method of claim 5, wherein determining the number of bits in the at least one bit of the information bit vector comprises:
performing a density evolution operation on the second polar code based at least in part on the channel metric.

7. The method of claim 5, wherein determining the number of bits in the at least one bit of the information bit vector comprises:
identifying the number of bits in a look-up table based at least in part on the channel metric.

8. The method of claim 5, wherein determining the number of bits in the at least one bit of the information bit vector comprises:
determining a magnitude of a difference between the channel metric and an initial channel metric measured prior to the receiving the first set of encoded bits.

9. The method of claim 5, further comprising:
determining a respective coded bit metric for each bit of the second set of encoded bits based at least in part on the channel metric and a modulation order for the second set of encoded bits, wherein the number of bits is based at least in part on the respective coded bit metrics.

10. The method of claim 1, further comprising:
measuring the channel metric subsequent to the transmitting the first set of encoded bits.

11. The method of claim 1, further comprising:
transmitting, to the device, a trigger to provide channel feedback, wherein the trigger is transmitted after the indication that the first set of encoded hits was unsuccessful and prior to the transmitting the second set of encoded bits.

12. The method of claim 1, wherein the first set of encoded bits comprises a subset of encoded bits of a codeword generated by the first polar code.

13. The method of claim 12, wherein the second set of encoded bits comprises a second subset of encoded bits of a second codeword generated by the second polar code.

14. A method for wireless communication, comprising:
receiving a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized hit channels;

transmitting, to the device, an indication that a decoding of the first set of encoded bits was unsuccessful;

receiving a second set of encoded bits from the device over the wireless channel, the second set of encoded bits generated by mapping a repetition of at least one bit of the information bit vector to at least one bit channel of a second set of polarized bit channels of a second polar code according to a second bit index set, wherein the second polar code is a superset of the first polar code, and wherein the at least one bit channel is determined based at least in part on a channel metric of the wireless channel measured subsequent to the receiving the first set of encoded bits; and obtaining the information bit vector by decoding the first and second sets of encoded bits.

15. The method of claim 14, further comprising:
receiving, in a control transmission scheduling the second set of encoded bits, an indication of the channel metric or a number of bits in the at least one bit of the information bit vector.

16. The method of claim 14, wherein the channel metric comprises a signal-to-noise ratio (SNR), a channel quality indicator (CQI), a reference signal received power (RSRP), a reference signal received quality (RSRQ), or a combination thereof.

17. The method of claim 14, further comprising:
transmitting channel feedback to the device over the wireless channel after the receiving the first set of encoded bits, the channel feedback comprising the channel metric, an initial channel metric measured prior to the receiving the first set of encoded bits, a magnitude of a difference between the channel metric and the initial channel metric, or a combination thereof.

18. The method of claim 14, further comprising:
measuring the channel metric subsequent to the receiving the first set of encoded bits.

19. The method of claim 14, further comprising:
determining a number of bits in the at least one bit of the information bit vector.

20. The method of claim 19, wherein determining the number of bits in the at least one bit of the information bit vector comprises:
performing a density evolution operation on the second polar code based at least in part on the channel metric.

21. The method of claim 19, wherein determining the number of bits in the at least one bit of the information bit vector comprises:
identifying the number of bits in a look-up table based at least in part on the channel metric.

22. The method of claim 19, wherein determining the number of hits in the at least one bit of the information bit vector comprises:
determining a magnitude of a difference between the channel metric and an initial channel metric measured prior to the receiving the first set of encoded bits.

23. The method of claim 19, further comprising:
determining a respective coded bit metric for each bit of the second set of encoded bits based at least in part on the channel metric and a modulation order for the second set of encoded bits, wherein the number of bits is based at least in part on the respective coded bit metrics.

24. The method of claim 14, further comprising:
receiving, from the device, a trigger to provide channel feedback, wherein the trigger is received after the indication that the first set of encoded bits was unsuccessful and prior to the receiving the second set of encoded bits.

25. The method of claim 14, wherein the first set of encoded bits comprises a subset of encoded bits of a codeword generated by the first polar code.

26. The method of claim 25, wherein the second set of encoded bits comprises a second subset of encoded bits of a second codeword generated by the second polar code.

27. An apparatus for wireless communication, comprising:
a processor,
memory in electronic communication with the processor; and
instructions stored in the memory and executable by the processor cause the apparatus to:
generate a first set of encoded bits by mapping an information bit vector to a first set of polarized bit channels of a first polar code according to a first bit index set, the first bit index set being based on respective bit channel reliabilities of the first set of polarized bit channels;
transmit the first set of encoded bits to a device over a wireless channel;
receive, from the device, an indication that a decoding of the first set of encoded bits was unsuccessful;
generate a second set of encoded bits by mapping a repetition of at least one bit of the information bit vector to at least one hit channel of a second set of polarized bit channels of a second polar code according to a second bit index set, wherein the second polar code is a superset of the first polar code, and wherein the at least one bit channel is determined based at least in part on a channel metric of the wireless channel measured subsequent to the receiving the first set of encoded bits; and
transmit the second set of encoded bits to the device over the wireless channel.

28. The apparatus of claim 27, wherein the instructions are further executable by the processor to cause the apparatus to:
transmit, in a control transmission scheduling the second set of encoded hits, an indication of the channel metric or a number of bits in the at least one bit of the information bit vector.

29. The apparatus of claim 27, wherein the channel metric comprises a signal to noise ratio (SNR), a channel quality indicator (CQI), a reference signal received power (RSRP), a reference signal received quality (RSRQ), or a combination thereof.

30. An apparatus for wireless communication, comprising:
a processor,
memory in electronic communication with the processor; and
instructions stored in the memory and executable by the processor to cause the apparatus to:
receive a first set of encoded bits from a device over a wireless channel, the first set of encoded bits generated by mapping an information bit vector to a first set of polarized bit channels of a first polar code according to a first bit index set, the first bit index set being based on respective bit channel reliabilities of the first set of polarized bit lip channels;
transmit, to the device, an indication that a decoding of the first set of encoded bits was unsuccessful;
receive a second set of encoded bits from the device over the wireless channel, the second set of encoded bits generated by mapping a repetition of at least one bit of the information bit vector to at least one bit channel of a second set of polarized bit channels of a second polar code according to a second bit index set, wherein the second polar code is a superset of the first polar code, and wherein the at least one bit channel is determined based at least in part on a channel metric of the wireless channel measured subsequent to the receiving the first set of encoded bits; and
obtain the information bit vector by decoding the first and second sets of encoded bits.

* * * * *